United States Patent [19]

Tada

[11] Patent Number: 5,663,686
[45] Date of Patent: Sep. 2, 1997

[54] CHARGE PUMP CIRCUIT AND PHASE LOCKED LOOP CIRCUIT USING THE CHARGE PUMP CIRCUIT

[75] Inventor: Masashige Tada, Tokyo, Japan

[73] Assignee: Mitsubishi Denki Kabushiki Kaisha, Tokyo, Japan

[21] Appl. No.: 589,244

[22] Filed: Jan. 23, 1996

[30] Foreign Application Priority Data

Aug. 22, 1995 [JP] Japan .................. 7-213528

[51] Int. Cl.$^6$ .................. H03L 7/085
[52] U.S. Cl. .................. 331/8; 331/17; 331/25; 327/157
[58] Field of Search .................. 331/17, 25, 8; 327/148, 157

[56] References Cited

U.S. PATENT DOCUMENTS 4,714,900  12/1987  Sata .................. 331/17
5,362,990  11/1994  Alvarez et al. .................. 331/17
5,497,127   3/1996  Sauer .................. 331/17

*Primary Examiner*—Siegfried H. Grimm
*Attorney, Agent, or Firm*—Leydig, Voit & Mayer

[57] ABSTRACT

A charge pump with which a dynamic range of control voltage can be set broadly and a phase locked loop using the charge pump. The charge pump includes first, second and third transistors having respective first terminals for supplying constant currents to an output terminal. A second terminal of the first transistor is connected through a resistor to a power source. Second terminals of the second and third transistors are grounded through respective first and second T/M circuits (transmission gate analog switch circuits). A DOWN signal is applied to the first T/M circuit, and an inverted UP signal is applied to the second T/M circuit, in order to supply or draw out current via the output terminal.

12 Claims, 20 Drawing Sheets

SWITCHES AND Iout OF EACH MODE

| | UP SIGNALS | DOWN SIGNALS | T/M 42 | T/M 43 | CURRENT Iout |
|---|---|---|---|---|---|
| UP MODE | H | L | OFF | OFF | Iout = I₁ |
| DOWN MODE | L | H | ON | ON | Iout = −I₁ |
| SYNCHRONIZATION MODE | L (H) | L (H) | ON (OFF) | OFF (ON) | Iout = 0 |

FIG. 10

SWITCHES AND Iout OF EACH MODE

| | UP SIGNALS | DOWN SIGNALS | SW1 | SW2 | CURRENT Iout |
|---|---|---|---|---|---|
| UP MODE | H | L | OFF | OFF | Iout = I1 |
| DOWN MODE | L | H | ON | ON | Iout = -I1 |
| SYNCHRONIZATION MODE | L (H) | L (H) | ON (OFF) | OFF (ON) | Iout = 0 |

FIG. 15 (PRIOR ART)

CHARGE PUMP CIRCUIT AND PHASE LOCKED LOOP CIRCUIT USING THE CHARGE PUMP CIRCUIT

BACKGROUND OF THE INVENTION

1. Field of the Invention

The invention relates to a charge pump circuit used for a PLL circuit (phase locked loop circuit) and a PLL circuit in which the charge pump circuit is used.

2. Description of the Prior Art

FIG. 12 shows a PLL circuit which comprises a digital phase comparator 210, a charge pump circuit 220, a lowpass filter 300 and a voltage control oscillator 400. The charge pump circuit 220 is connected to an output side of a digital phase comparator 210 in a PLL circuit to drive the low pass filter.

Charge pump circuit 220 draws or supplies current from node N1 according to up-signal UP and down-signal DOWN which are inputted from the up-terminal and the down-terminal of a digital phase comparator, respectively.

Digital phase comparator 210 receives input signal A and input signal B, and then makes the up-signal UP and the down-signal DOWN active state/non-active state, respectively, according to a phase difference between input signal A and input signal B. The digital phase comparator 210 then outputs up-signal UP and down-signal DOWN into charge pump circuit 220.

Charge pump circuit 220 comprises constant current sources 221 and 222 and switch means 223 and 224, which are inserted between power source Vcc and an earth. Switch means 223 turns on when up-signal UP is in active state and supplies node N1 which is an output portion with constant current $I_0$ from constant current source 221. Switch means 224 turns on when down-signal DOWN is in an active state and draws out constant current $I_0$ from node N1 by constant current source 222.

FIG. 19 is a timing chart which shows an operation of charge pump circuit 220 according to input signal A and input signal B. As shown in FIG. 19, while rising edge of input signal B is behind rising edge of input signal A, up-signal UP is activated and supplies node N1 with constant current $I_0(+I_0)$. While rising edge of input signal B precedes rising edge of input signal A, down-signal DOWN is activated and constant current $I_0$ is drawn out ($-I_0$) from node N1.

Lowpass filter 300, having capacitors 311 and 313 and resistor 312, smoothes voltage which is provided from node N1 in charge pump circuit 220 and outputs control voltage SV to voltage control oscillator 400. Voltage control oscillator 400 outputs signal B whose frequency is in proportion to control voltage SV and sends signal B to one input terminal of the digital phase comparator 210.

In such a PLL circuit, (1) when the phase of input signal B is behind the phase of input signal A, digital phase comparator 210 outputs up-signal UP in the active state. Thereby, lowpass filter 300 raises control voltage SV in order to raise frequency of output signal B of voltage control oscillator 400. (2) When the phase of input signal B precedes the phase of input signal A, digital phase comparator 210 outputs down-signal DOWN in the active state. Thereby, lowpass filter 300 lowers control voltage SV in order to lower frequency of output signal B of voltage control oscillator 400. Consequently, the PLL circuit operates so that phase difference between the input signal A and the input signal B decreases. Ultimately, the input signal B, whose phase is synchronized with the input signal A, is provided.

FIG. 13 is a circuit diagram which shows a concrete internal construction of charge pump circuit 220. As shown in FIG. 13, a base of PNP bipolar transistor 23 and a base of PNP bipolar transistor 25 are connected mutually to comprise a current mirror circuit. An emitter of PNP bipolar transistor 23 is connected to power source Vcc through resistor 22. An emitter of PNP bipolar transistor 25 is connected to power source Vcc through resistor 24. A collector of PNP bipolar transistor 25 is connected to output terminal 20.

NPN bipolar transistor 26 and NPN bipolar transistor 27 mutually construct a differential pair and respective bases of NPN bipolar transistors 26 and 27 receive down-signal DOWN and inverted down-signal/DOWN (bar codes in figures correspond to "/" in the specification). A collector of NPN bipolar transistor 26 is connected to output terminal 20 and a collector of NPN bipolar transistor 27 is connected to power source Vcc. Emitters of NPN bipolar transistors 26 and 27 are connected in common.

NPN bipolar transistor 28 and NPN bipolar transistor 29 mutually construct a differential pair and respective bases of NPN bipolar transistors 28 and 29 receive up-signal UP and inverted up-signal/UP. A collector of NPN bipolar transistor 28 is connected to power source Vcc and a collector of NPN bipolar transistor 29 is connected to output terminal 20. Emitters of NPN bipolar transistors 28 and 29 are connected in common.

Bases of NPN bipolar transistors 32, 35 and 36 are connected in common to a base of NPN bipolar transistor 30 whose base is connected to its collector. Thereby, NPN bipolar transistors 32, 35 and 36 are connected to NPN bipolar transistor 30 to construct a current mirror circuit.

A collector of NPN bipolar transistor 30 is connected to power source Vcc through constant current source 13, and an emitter of NPN bipolar transistor 30 is grounded through resistor 31. A collector of NPN bipolar transistor 32 is connected to a collector and a base of NPN bipolar transistor 23, while an emitter of NPN bipolar transistor 32 is grounded through resistor 33. A collector of NPN bipolar transistor 35 is connected to common emitters of NPN bipolar transistors 26 and 27, and an emitter of NPN bipolar transistor 35 is grounded through resistor 34. A collector of NPN bipolar transistor 36 is connected to common emitters of NPN bipolar transistors 28 and 29, while an emitter of NPN bipolar transistor 36 is grounded through resistor 37.

Transistor sizes of PNP bipolar transistors 23 and 25 are the same, while transistor sizes of NPN bipolar transistors 26~36 are the same.

In such a charge pump circuit, since NPN bipolar transistors 32, 35 and 36 are connected to NPN bipolar transistor 30 as current mirror, respective collector current of PNP bipolar transistor 25, respective collector currents of NPN bipolar transistor 35 and NPN bipolar transistor 36 are equal to constant current $I_0$ supplied from constant current source 13.

On the other hand, when input signal B is behind input signal A as shown in FIG. 19, up-signal UP of digital phase comparator 210 is in an active state (H level), while down-signal DOWN is in a non-active state (L level).

In such a circuit, in case that input signal B is behind input signal A as shown in FIG. 19, when up-signal UP (H) and down-signal DOWN (L) are inputted to up-terminal 14 and down-terminal 15 of charge pump circuit 220, respectively, down-signal DOWN (L) and inverted down-signal DOWN (H) are applied to NPN bipolar transistors 26 and 27, respectively. Then, NPN bipolar transistor 26 turns off and NPN bipolar transistor 27 turns on.

On the other hand, up-signal UP (H) and inverted up-signal/UP (L) are applied to NPN bipolar transistors 28 and 29, respectively. Then, NPN bipolar transistor 28 turns on and NPN bipolar transistor 29 turns off. Accordingly, current flows through neither NPN bipolar transistor 26 nor NPN bipolar transistor 29. Therefore, as shown in FIG. 16, constant current $I_0$ is supplied from output terminal 20 only from a collector of PNP bipolar transistor 25.

As shown in FIG. 19, in case of input signal B precedes input signal A, when up-signal UP (L) and down-signal DOWN (H) are inputted to up-terminal 14 and down-terminal 15 of charge pump circuit 220, respectively, down-signal DOWN (H) and inverted down-signal/DOWN (L) are applied to NPN bipolar transistors 26 and 27. Then, NPN bipolar transistor 26 turns on and NPN bipolar transistor 27 turns off.

On the other hand, up-signal (L) and inverted up-signal (H) are applied to NPN bipolar transistors 28 and 29, respectively. Then, NPN bipolar transistor 28 turns off and NPN bipolar transistor 29 turns on. Accordingly, current flows through both NPN bipolar transistor 26 and NPN bipolar transistor 29. Therefore, as shown in FIG. 17, constant current $I_0$ is supplied to output terminal 20 from a collector of PNP bipolar transistor 25, while $2I_0$ is drawn out from NPN bipolar transistors 26 and 29. Accordingly, constant current $I_0$ is drawn out from output terminal 20, since $I_0-2I_0=-I_0$.

In case that input signal A synchronizes with input signal B, up-signal UP (L) and down-signal DOWN (L) or up-signal UP (H) and down-signal DOWN (H) are inputted. As shown in FIGS. 18A, 18B, constant current $I_0$ is supplied from output terminal 20 from PNP bipolar transistor 25, and the same amount of constant current $I_0$ is drawn out by either NPN bipolar transistor 26 or 27. Accordingly, current is not supplied from output terminal 20, since $I_0-I_0=0$.

As described above, charge pump circuit 220 supplies or draws out constant current $I_0$ via output terminal 20 according to respective modes of up-signal UP and down-signal DOWN of digital phase comparator 210. FIG. 15 shows a table which shows the above mentioned operation, and shows relationship between switch state and output current at each mode in a conventional charge pump circuit.

FIGS. 20A, 20B show how to calculate a dynamic range of output voltage 20 in a conventional charge pump circuit 220. As shown in FIG. 20A, an output voltage range of output terminal 20 in this circuit is calculated by following formula, $$Vcc-3 V_{BE}-2 \Delta V_R,$$

where $\Delta V_R$: voltage which is generated by an emitter resistance of a transistor (about 0.3 V), $V_{BE}$: Voltage between base and emitter of a transistor (about 0.7 V).

As shown in FIG. 20B, upper limit of dynamic range $V_{UP}$ can be calculated by following formula, $$\begin{aligned} V_{UP} &= Vcc-(V_{BE}+\Delta V_R) \\ &= 5V-(0.7V+0.3V) \\ &= 4V, \end{aligned}$$

lower limit of dynamic range can be calculated by following formula, $$\begin{aligned} V_{DOWN} &= Vcc-(3V_{BE}+2\Delta V_R) \\ &= 5V-(3 \times 0.7V+2 \times 0.3V) \\ &= 1.7V. \end{aligned}$$

Accordingly, dynamic range $V_D$ can be calculated by following formula, $V_D$=upper limit of dynamic range $V_{UP}$–lower limit of dynamic range $V_{DOWN}$=4 V–1.7 V=2.3 V.

Accordingly, dynamic range in a conventional circuit is affected by base emitter voltage $3 \times V_{BE}$ of a transistor connected in three cascade stages between a power source and an earth and the dynamic range is only 2.3 V. The range that VCO can follow its input frequency in a PLL circuit is usually called a lock range of PLL. There is a problem that this lock range gets narrower if output dynamic range of output terminal 20 is small. This phenomenon especially appears conspicuous in reduced voltage operation or low voltage operation of PLL circuit.

The object of the present invention is to provide a charge pump circuit which makes it possible to set a broad dynamic range of output voltage, and to provide a PLL circuit which makes it possible to set a broad dynamic range.

SUMMARY OF THE INVENTION

According to one aspect of the invention, a charge pump circuit comprises a first circuit for supplying first constant current to an output terminal; a second circuit for supplying second constant current to the output terminal; a third circuit for supplying third constant current to the output terminal; a fourth circuit comprising a fourth transistor which is connected to said first circuit by current mirror connection for supplying constant current to said first circuit, and further comprising a fifth transistor for supplying constant current to the fourth transistor; and a fifth circuit comprising a sixth transistor which is connected to a first constant current source in series for supplying constant current to the fifth transistor in the fourth circuit, to the second transistor in the second circuit and to the third transistor in the third circuit which are connected by current mirror connection; wherein, respective one ends of from first to third transistors are connected to the output terminal, other end of the first transistor is connected to a power source through a first resistor, other end of the second transistor is grounded through the first T/M circuit, other end of the third transistor is grounded through the second T/M circuit, and an inverted up-signal is applied to the first T/M circuit, a down-signal is applied to the second T/M circuit in order to supply or draw out current via the output terminal.

T/M circuits are more commonly known as transmission gate analog switch circuits. For example, the T/M circuit may be a switch that is actuated when an input signal has logic 1 (H level) and is deactuated when the input signal has a logic 0 (L level).

According to another aspect of the invention, a charge pump circuit comprises a first circuit for supplying first constant current to an output terminal; a second circuit for supplying second constant current to the output terminal; a third circuit comprising a third transistor which is connected to the first circuit by current mirror connection for supplying constant current to the first circuit, and further comprising a fourth transistor for supplying constant current to the third transistor; and a fourth circuit comprising a fifth transistor which is a connected to constant current source in series for supplying constant current to the fourth transistor in the third circuit, to a second transistor in the second circuit which are connected by current mirror connection; wherein, respective one ends of a first and a second transistors are connected to the output terminal, other end of the first transistor is connected to a power source through a first T/M circuit, other end of the second transistor is grounded through the second T/M circuit, and an up-signal is applied to the first T/M circuit, a down-signal is applied to the second T/M circuit in order to supply or draw out current via the output terminal.

According to further aspect of the invention, a charge pump circuit comprises a first circuit for supplying first constant current to an output terminal; a second circuit for supplying second constant current to the output terminal; a third circuit comprising a third transistor which is connected to the first circuit by current mirror connection for supplying constant current to the first circuit, and further comprising a first constant current source for supplying constant current to the third transistor; and a fourth circuit comprising a first T/M circuit connected in series to constant a second current source, a second T/M circuit connected in series to a third constant current source, the two serial circuits are connected in parallel to each other for providing constant current to a fourth transistor, the fourth transistor is connected to the second transistor by current mirror connection for supplying constant current thereto; wherein, an inverted up-signal is applied to the first T/M circuit, a down-signal is applied to the second T/M circuit in order to supply or draw out current via the output terminal.

According to another aspect of the invention, a PLL circuit comprising a phase comparison means which receives a first and a second input signals and outputs comparison signals according to the phase difference between the first and second input signals, a charge pump circuit which outputs voltage according to the comparison signals, a filtering circuit which outputs control voltage by filtering the output voltage received from the charge pump circuit and an oscillation means which outputs the second input signals whose oscillation frequency is controlled by the control voltage: wherein, the charge pump circuit comprises, a first circuit for supplying first constant current to an output terminal; a second circuit for supplying second constant current to the output terminal; a third circuit for supplying third constant current to the output terminal; a fourth circuit comprising a fourth transistor which is connected to the first circuit by current mirror connection for supplying constant current to the first circuit, and further comprising a fifth transistor for supplying constant current to the fourth transistor; and a fifth circuit comprising a sixth transistor which is connected to a first constant current source in series for supplying constant current to the fifth transistor in the fourth circuit, to the second transistor in the second circuit and to the third transistor in the third circuit which are connected by current mirror connection; wherein, respective one ends of from first to third transistors are connected to the output terminal, other end of the first transistor is connected to a power source through a first resistor, other end of the second transistor is grounded through the first T/M circuit, other end of the third transistor is grounded through the second T/M circuit, and an inverted up-signal is applied to the first T/M circuit, a down-signal is applied to the second T/M circuit in order to supply or draw out current via the output terminal.

BRIEF DESCRIPTION OF THE DRAWINGS

FIG. 10 shows the relation between T/M circuit and output current at each mode of a charge pump circuit in a fifth embodiment and sixth embodiment of the present invention.

FIG. 15 shows a relation between a switch at each mode in the conventional charge pump circuit and output current.

DETAILED DESCRIPTION OF THE PREFERRED EMBODIMENTS

Embodiment 1

Figure 1:
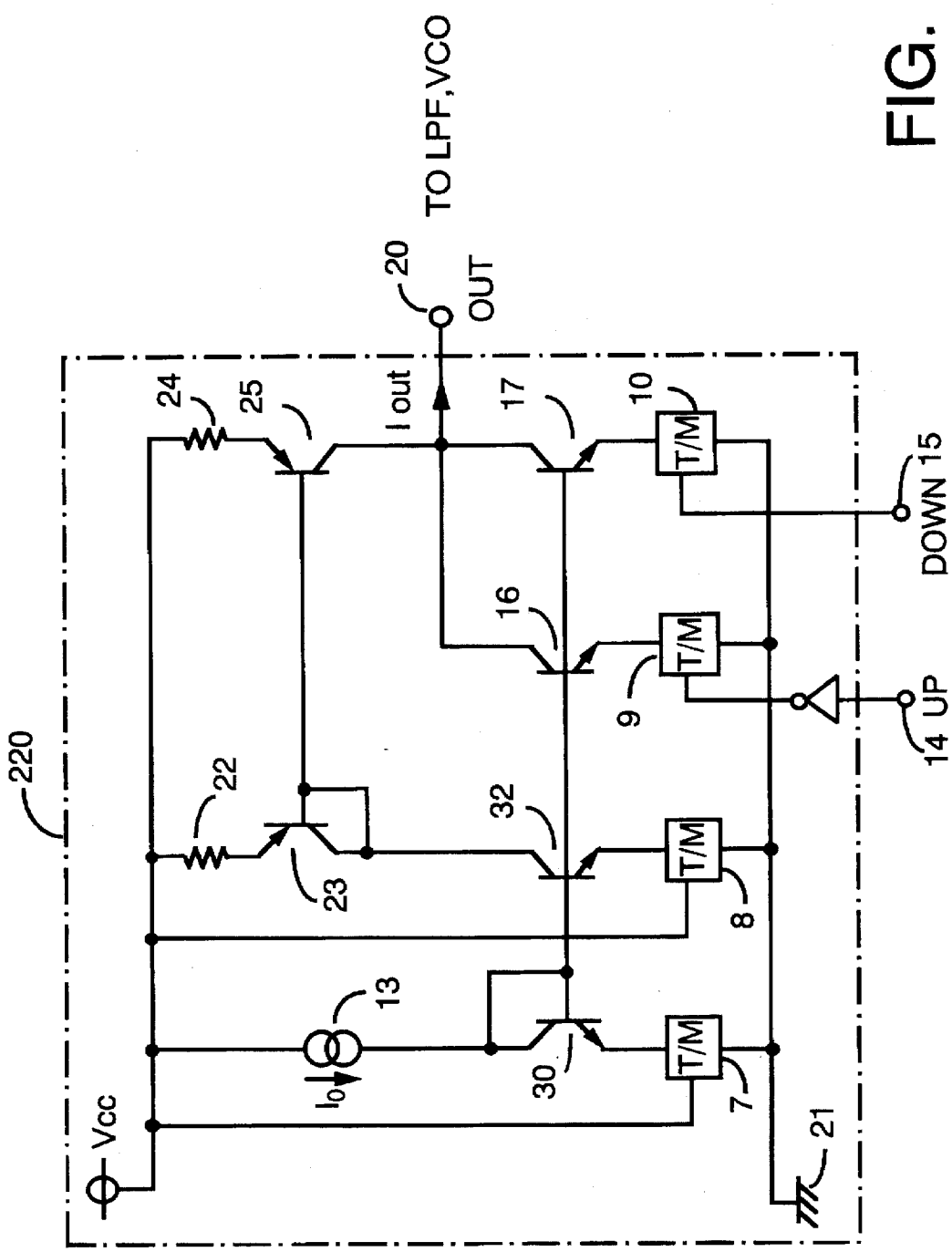
FIG. 1 shows a concrete construction of a charge pump circuit in a first embodiment of the present invention.

A first embodiment of the present invention is explained below. FIG. 1 shows a concrete construction of the charge pump circuit 220 in a first embodiment of the present invention. As shown in FIG. 1, PNP bipolar transistors 23 and 25 comprise a current mirror circuit by connecting their bases in common. An emitter of PNP bipolar transistor 23 is connected to power source Vcc through resistor 22 and an emitter of PNP bipolar transistor 25 is connected to power source Vcc through resistor 24. The base and the collector of PNP bipolar transistor 23 are connected to NPN bipolar transistor 32. A collector of PNP bipolar transistor 25 is connected to output terminal 20.

Bases of NPN bipolar transistors 32, 16 and 17 are connected in common to a base of NPN bipolar transistor 30 whose base is connected to its collector. Therefore, NPN bipolar transistors 32, 16 and 17 define a current mirror circuit with NPN bipolar transistor 30.

A collector of NPN bipolar transistor 30 is connected to power source Vcc through constant current source 13 and an emitter is grounded through T/M circuit 7. A collector of NPN bipolar transistor 32 is connected to the collector and base of NPN bipolar transistor 23, while an emitter is grounded through T/M circuit 8. A collector of NPN bipolar transistor 16 is connected to output terminal 20, while an emitter is grounded through T/M circuit 9. A collector of NPN bipolar transistor 17 is connected to output terminal 20, while an emitter is grounded through T/M circuit 10.

Transistor sizes of PNP bipolar transistors 23 and 25 are the same, while transistor sizes of NPN bipolar transistors 30, 32, 16 and 17 are also the same.

In such a charge pump circuit, since NPN bipolar transistors 32, 16 and 17 are connected to NPN bipolar transistor 30 as a current mirror, respective collector current of PNP bipolar transistor 25, respective collector currents of NPN bipolar transistors 16 and 17 are equal to constant current $I_0$ supplied from constant current source 13.

Figure 2A:
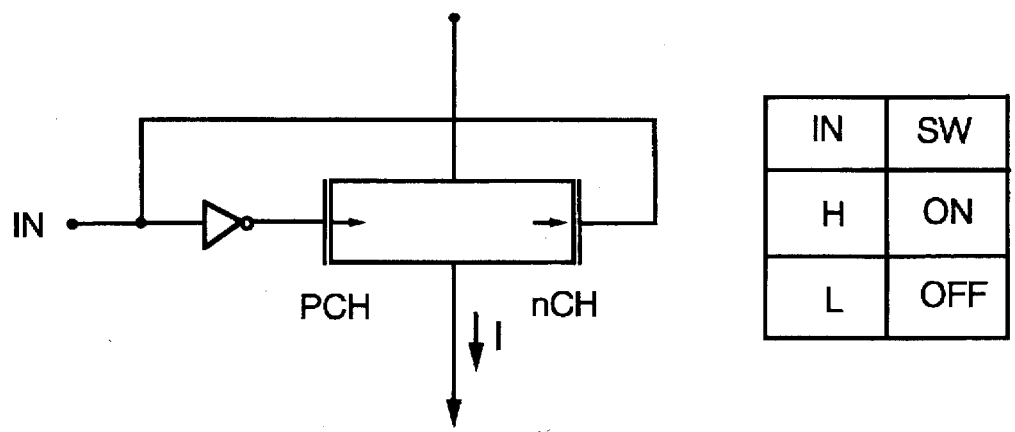
FIGS. 2A, 2B and 2C explain a construction and an operation of T/M circuit.
Figure 2B:
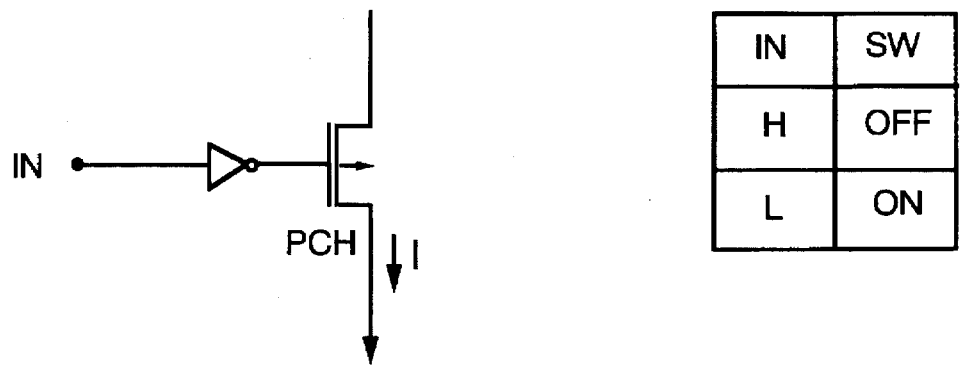
Figure 2C:
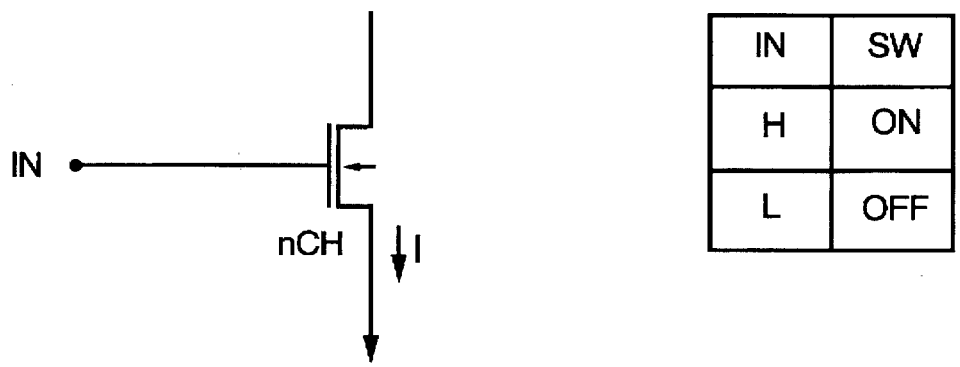

FIGS. 2A, 2B and 2C explain constructions and operations of T/M circuits 7–10. In FIG. 2A, in case of T/M circuit where CMOS of P channel and CMOS of N channel are connected in parallel, the circuit turns on when input signal is logical "1" (H level). On the other hand, the circuit turns off when input signal is logical "0" (L level). In FIG. 2B, in case of T/M circuit where an inverter is connected at preceding stage of CMOS of P channel, the circuit turns off when input signal is logical "1" (H level). On the other hand, the circuit turns on when input signal is logical "0" (L level). In FIG. 2C, in case of T/M circuit which comprises CMOS of N channel, the circuit turns on when input signal is logical "1" (H level). On the other hand, the circuit turns off when input signal is logical "0" (L level).

Figure 16:
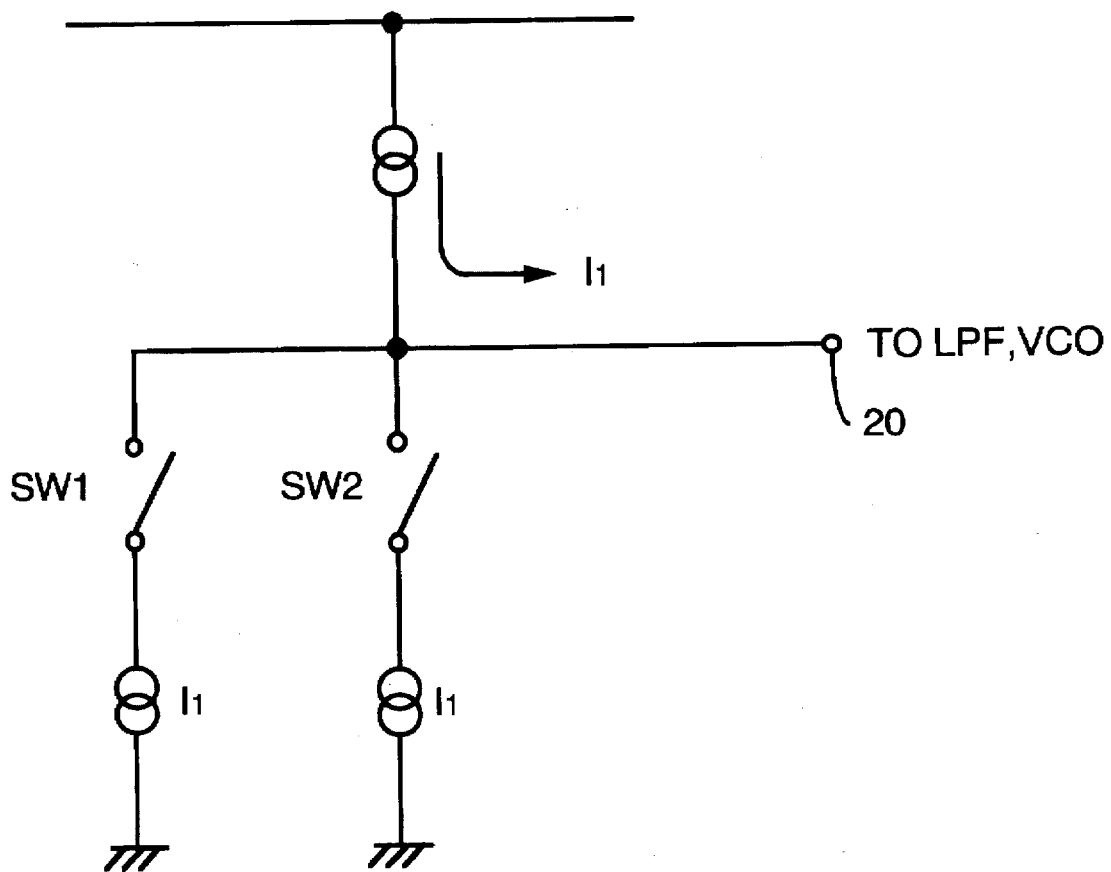
FIG. 16 shows a relation between a switch at UP mode in the conventional charge pump circuit and output current.
Figure 19:
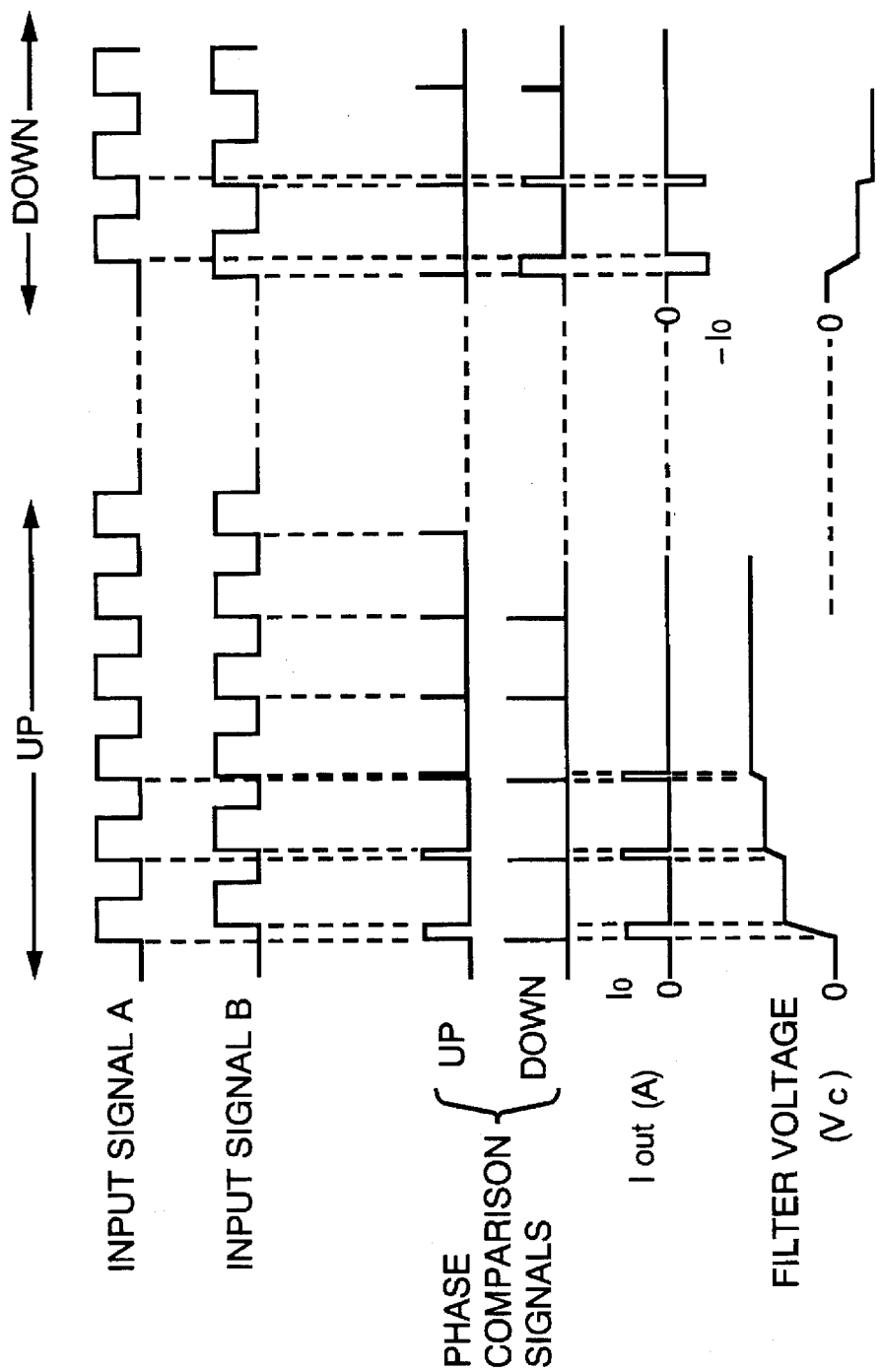
FIG. 19 is a timing chart showing an operation of a charge pump circuit based on input signal A and input signal B.
Figures 20A, 20B:
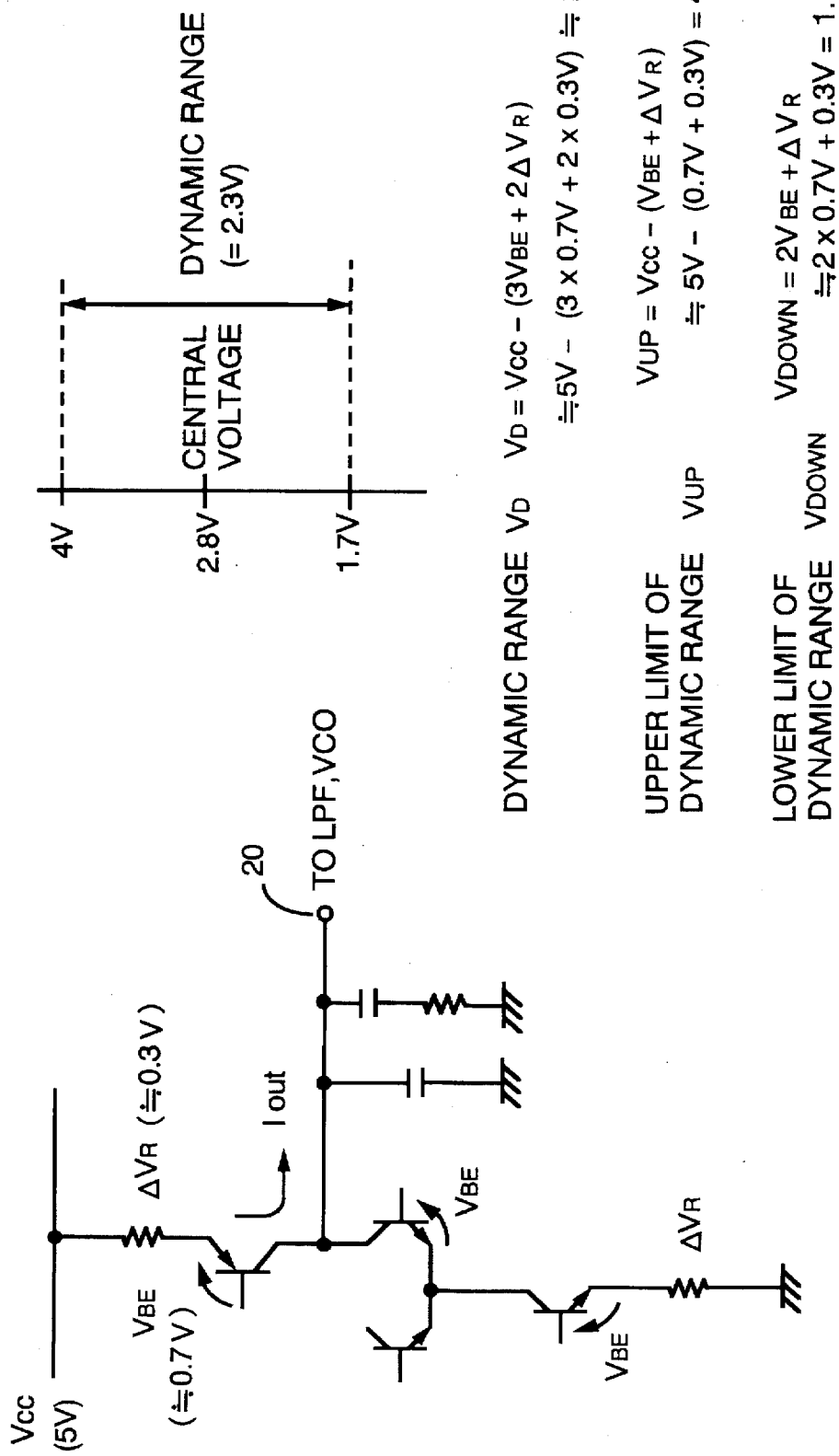
FIGS. 20A, 20B show how to calculate dynamic range of output voltage in the conventional charge pump circuit.

In the above mentioned circuit, where the input signal B follows input signal A, when up-signal UP (H) and down-signal DOWN (L) as shown in FIG. 19 are inputted to respective up-terminal 14 and down-terminal 15 of charge pump circuit 220, respectively, inverted up-signal (L) is applied to T/M circuit 9, down-signal DOWN (L) is applied to T/M circuit 10 and both of T/M circuits 9 and 10 turn off (see FIG. 16). Therefore, since no current flows through neither T/M circuit 9 nor T/M circuit 10, collector current $I_0$ is supplied to output terminal 20 only from PNP bipolar transistor 25.

Figure 17:
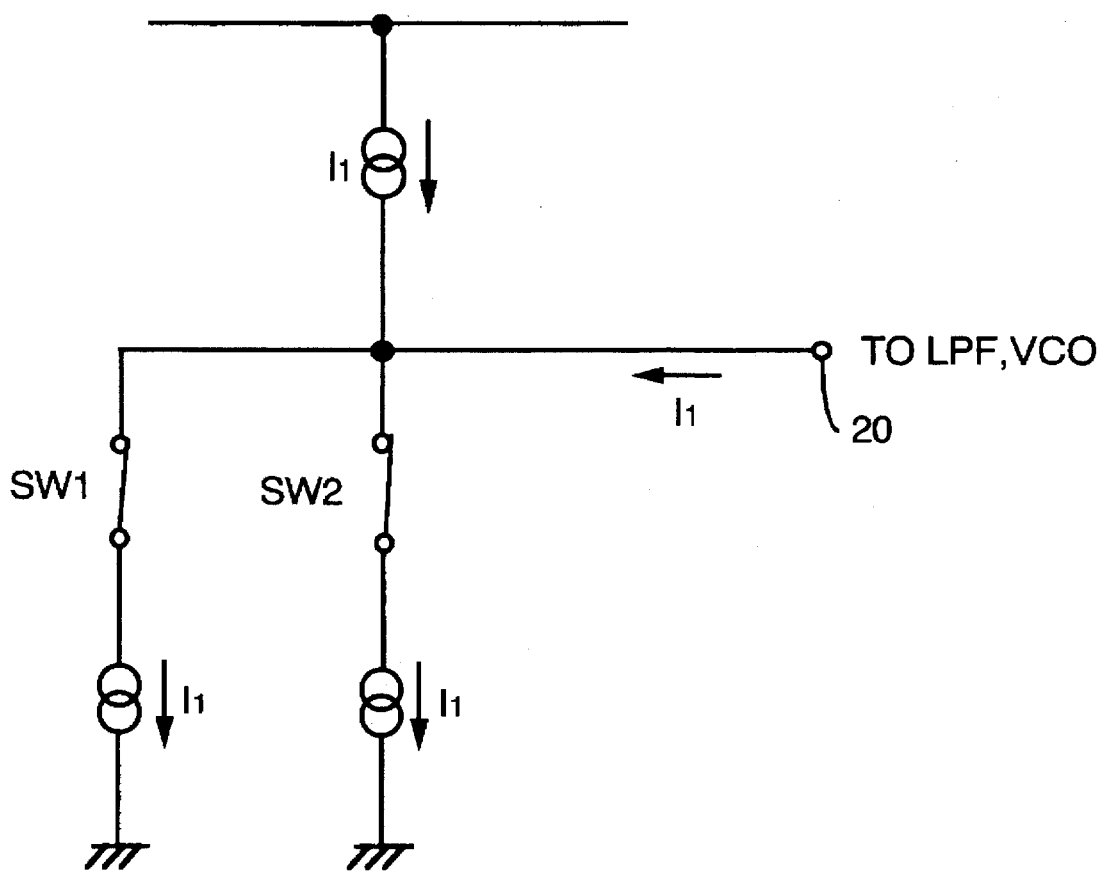
FIG. 17 shows a relation between a switch at DOWN mode in the conventional charge pump circuit and output current.
Figure 18A:
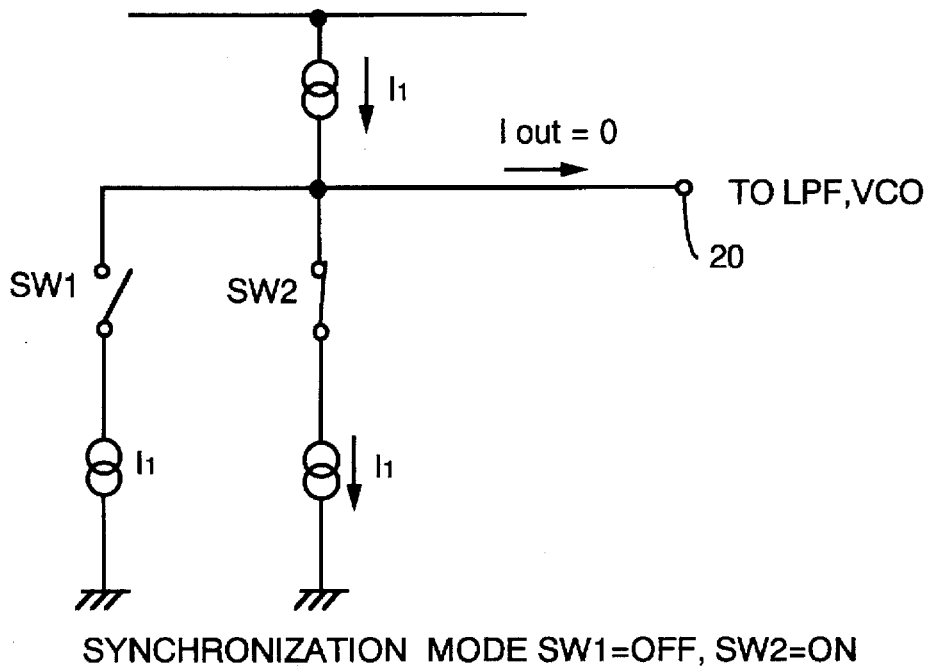
FIGS. 18A, 18B show a relation between a switch at synchronous mode in the conventional charge pump circuit and output current.
Figure 18B:
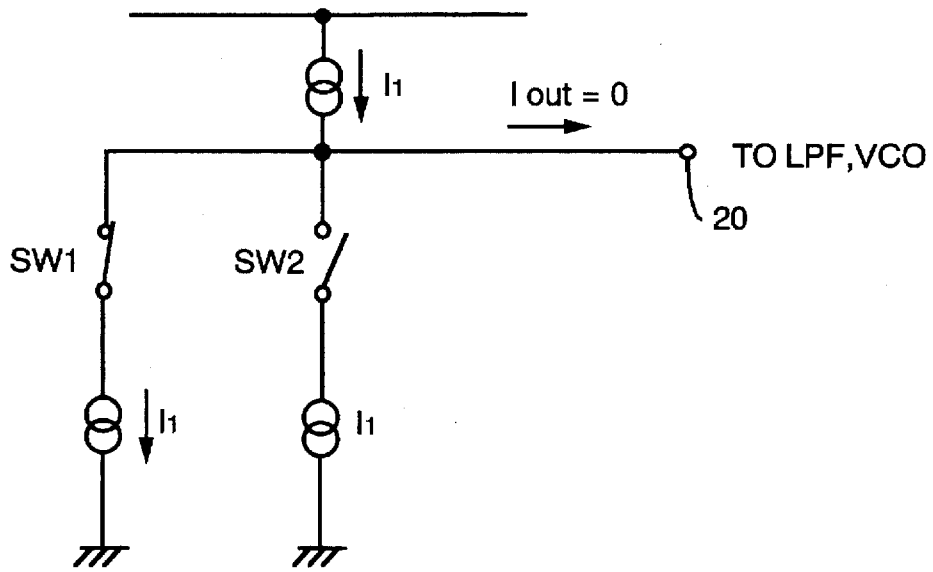

As shown in FIG. 19, in case that input signal B precedes input signal A, when up-signal UP (L) and down-signal DOWN (H) is inputted to up-terminal 14 and down-terminal 15 of charge pump circuit 220, respectively, inverted up-signal (H) is applied to T/M circuit 9, down-signal DOWN (H) is applied to T/M circuit 10 and then both of T/M circuits 9 and 10 turn on (see FIG. 17). Therefore, since current flows through both T/M circuit 9 and T/M circuit 10, PNP bipolar transistor 25 provides collector current $I_0$ to output terminal 20, and $2I_0$ is drawn out via T/M circuit 9 and T/M circuit 10. Accordingly, constant current $I_0$ is drawn out from output terminal 20, since $I_0-2I_0=-I_0$.

As described above, charge pump circuit 220 supplies or draws out constant current $I_0$ via output terminal 20 according to respective modes of up-signal UP and down-signal DOWN which are comparison output signals from digital phase comparator 210.

Figures 3A, 3B:
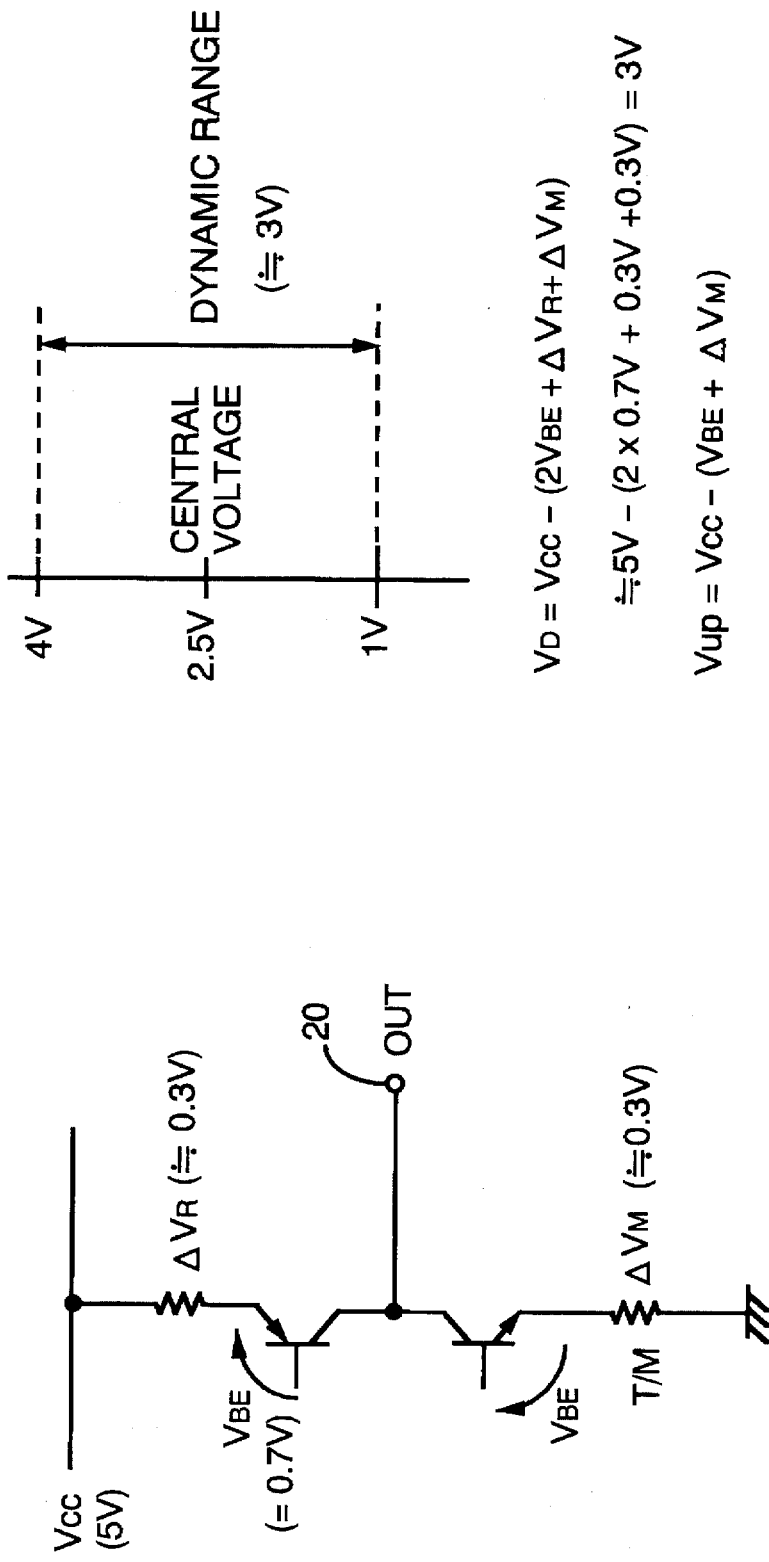
FIGS. 3A, 3B show how to calculate output dynamic range in a first embodiment and a second embodiment of the present invention.

FIGS. 3A, 3B show how to calculate output dynamic range in a first embodiment of the present invention. As shown in FIG. 3A, output dynamic range of output terminal 20 in this circuit can be calculated by following formula.

$$Vcc-2\ V_{BE}-(\Delta V_R+\Delta V_M),$$

where, $\Delta V_R$: voltage which is dropped an emitter resistor of a transistor (=approximately 0.3 V), $\Delta V_M$: voltage which is dropped at ON resistor of transmission gate connected to emitter resistor of transistor (=approximately 0.3 V)

($\Delta V_R$ and $\Delta V_M$ are usually selected to be substantially equal to each other), $V_{BE}$: voltage between a base and an emitter of a transistor (=approximately 0.7 V).

For example, the width of dynamic range is calculated as follows. As shown in FIG. 3B, upper limit $V_{UP}$ of dynamic range is calculated such as, $$V_{UP}=Vcc-(V_{BE}+\Delta V_R)=5\ V-0.7\ V+0.3\ V)=3\ V,$$

and lower limit $V_{DOWN}$ of dynamic range is calculated such as, $$V_{DOWN}=V_{BE}+\Delta V_M=0.7\ V +0.3\ V =1\ V.$$

Therefore, dynamic range $V_D$ is calculated such as, $V_D$=upper limit $V_{UP}$ of dynamic range−lower limit $V_{DOWN}$ of dynamic range=4 V−1 V =3 V.

Accordingly, dynamic range of the present invention improves its width by $V_{BE}$ (0.7 V) in comparison with 2.3 V of the dynamic range in the conventional circuit.

Figure 12:
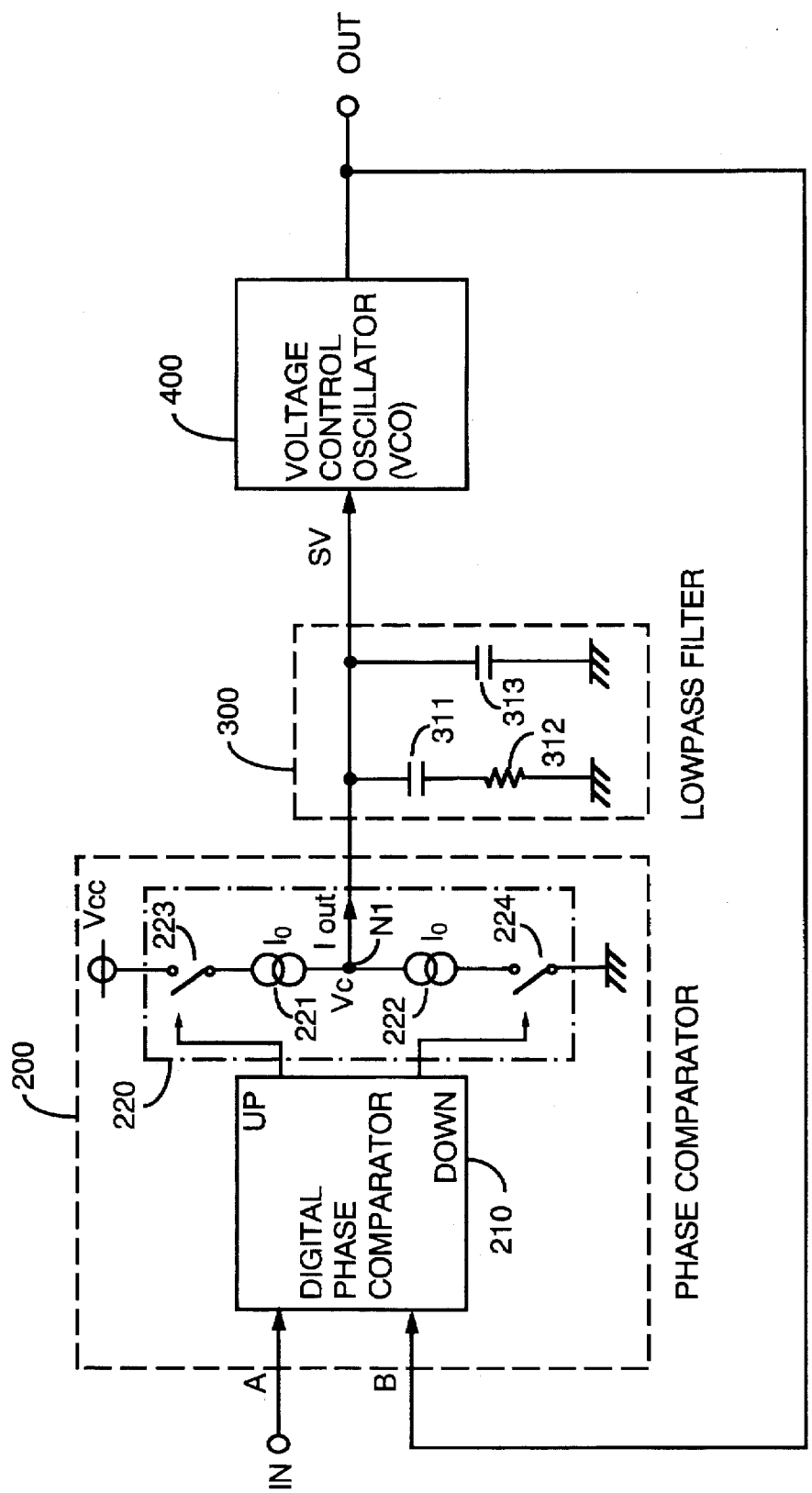
FIG. 12 shows one embodiment of conventional PLL (phase locked loop) comprising a digital phase comparator, a charge pump circuit, a lowpass filter and a voltage control oscillator.
Figure 13:
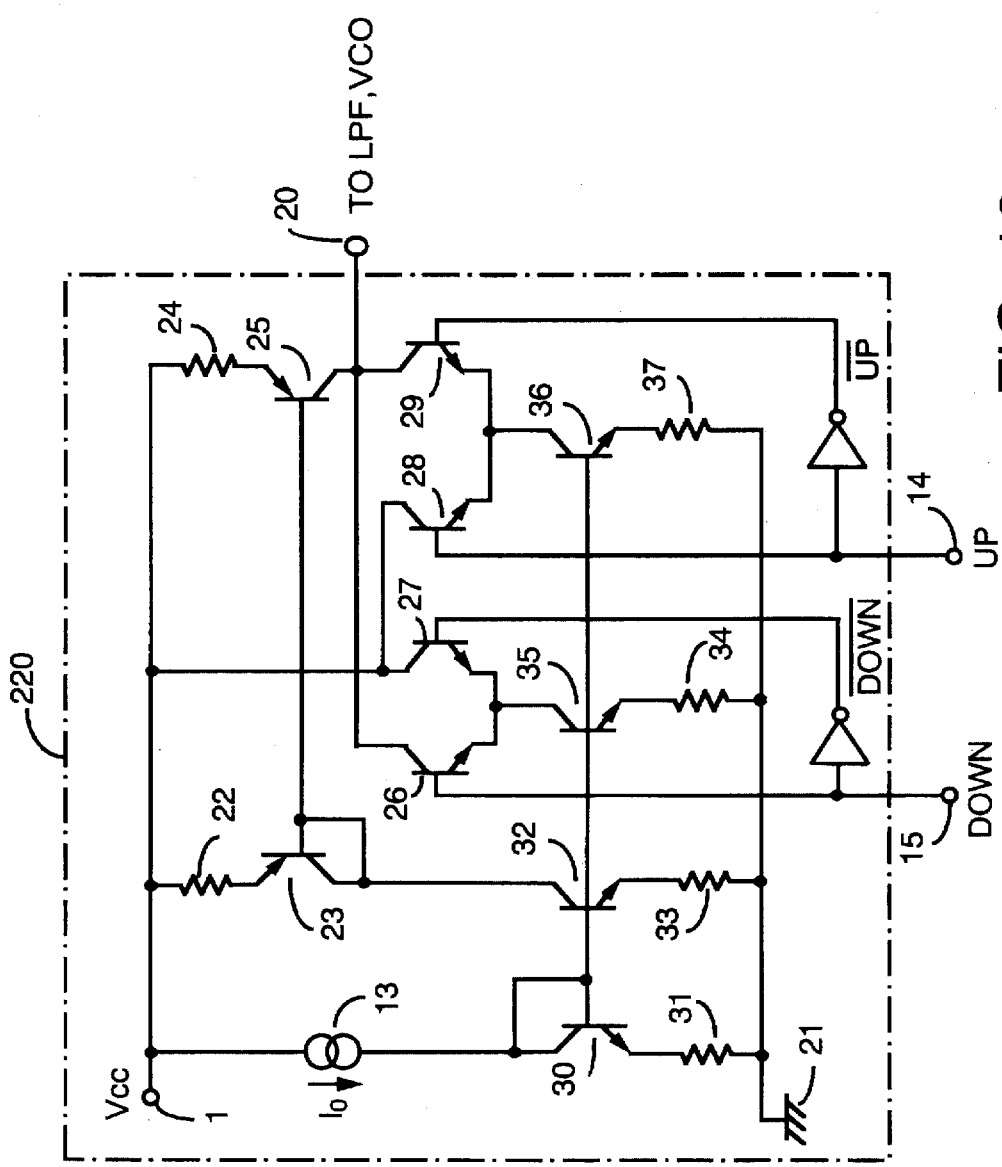
FIG. 13 shows a concrete construction of a conventional charge pump circuit.
Figure 14:
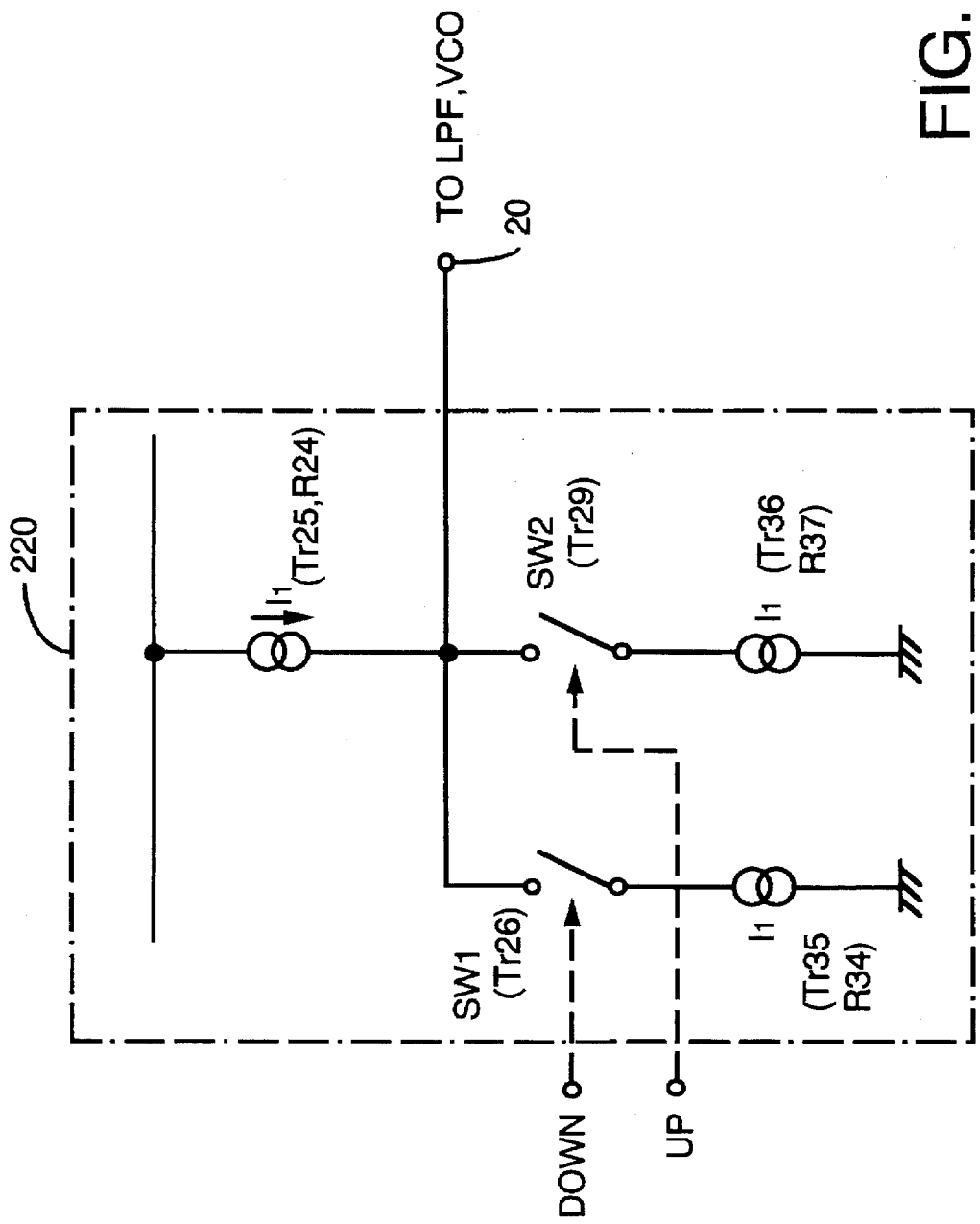
FIG. 14 shows a connection control relation between a constant current source in the conventional charge pump circuit, switches and output current.

As a result, in PLL circuit shown in FIG. 12, when charge pump circuit of the first embodiment is substituted for conventional charge pump circuit 220, voltage range of control voltage SV in voltage control oscillator 400 can be widened and width of oscillation frequency of input signal B, which is an output of voltage control oscillator 400, is also widened. Therefore, lock range of PLL circuit can be set wider than the conventional PLL circuit. This is advantageous especially when PLL circuit operates under reduced voltage or low voltage.

Embodiment 2

Figure 4:
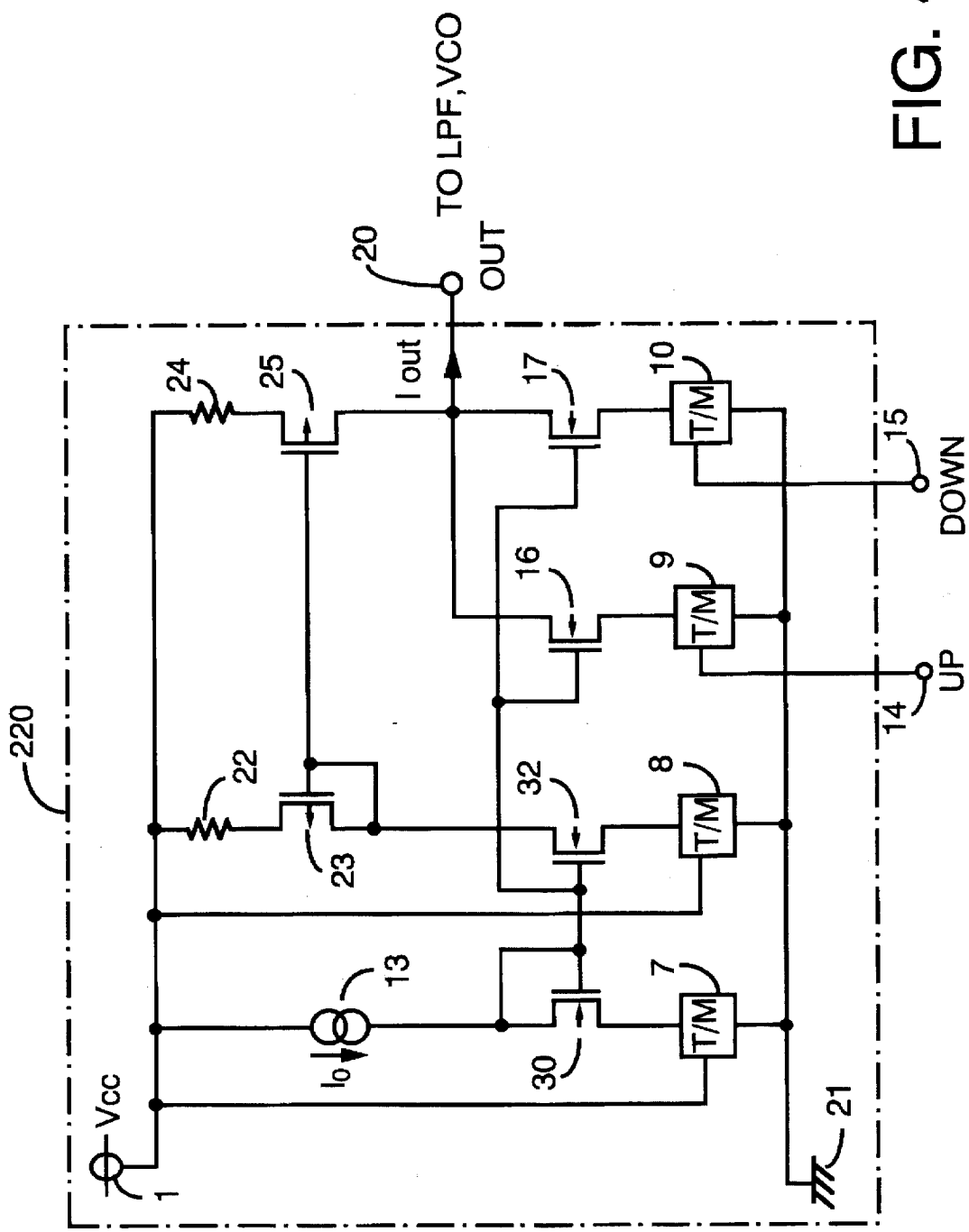
FIG. 4 shows a concrete construction of a charge pump circuit in a second embodiment of the present invention.

FIG. 4 shows a charge pump circuit in which PNP bipolar transistors 23 and 25 in the first embodiment (FIG. 1) are replaced by CMOS transistors 23 and 25, respectively, and NPN bipolar transistors 30, 32, 16 and 17 in FIG. 1 are replaced by CMOS transistors 30, 32, 16 and 17, respectively. Since an operation of the circuit in this second embodiment is the same as that of the circuit in the first embodiment, detailed explanation is omitted. In the second embodiment, every circuit is composed of CMOS. Therefore, manufacturing of PLL becomes easier than the first embodiment.

Embodiment 3

In the prior art, an output impedance at output terminal 20 is not in a high state in case of no phase error signals. Therefor, there has been a possibility for generating some leak current and also causing offset. In a third embodiment, however, it is possible to allow the output of the output terminal 20 to be in a high impedance state. Therefore, it is possible to construct PLL circuit having good accuracy.

Figure 5:
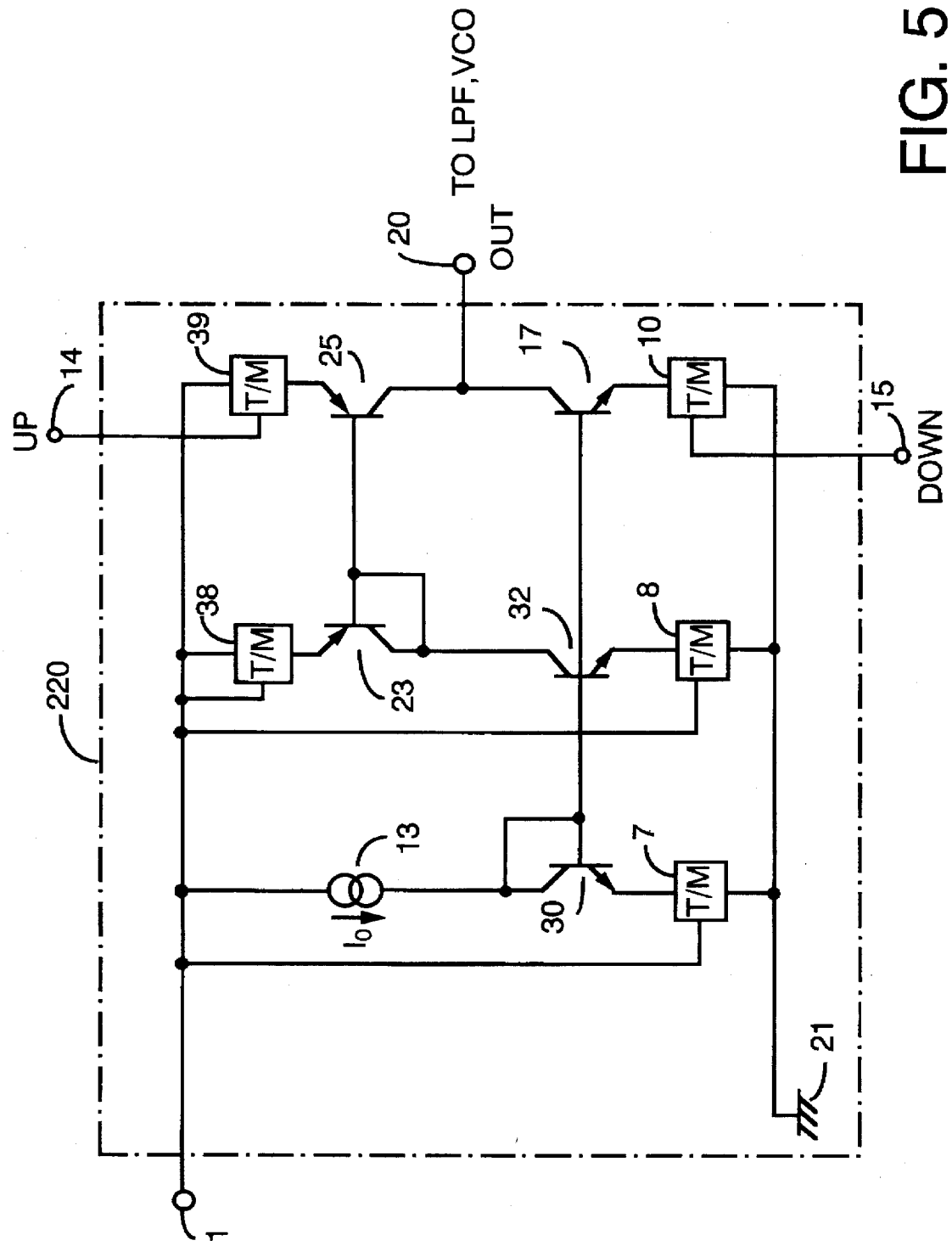
FIG. 5 shows a concrete construction of a charge pump circuit in a third embodiment of the present invention.

FIG. 5 shows the third embodiment in which OUT terminal 20 can be in a high impedance state. FIG. 5 is a circuit diagram which shows a concrete construction of a charge pump circuit 220 in the third embodiment. In this circuit, resistors 22 and 24 in FIG. 1 are replaced by T/M circuits 38 and 39, respectively, and NPN bipolar transistor 16 and T/M circuit 9 are removed. The third embodiment of the present invention is explained below.

As shown in FIG. 5, PNP bipolar transistors 23 and 25 comprise a current mirror circuit by connecting their bases in common. An emitter of PNP bipolar transistor 23 is connected to power source Vcc through T/M circuit 38, and an emitter of PNP bipolar transistor 25 is connected to power source Vcc through T/M circuit 39. A base and a collector of PNP bipolar transistor 23 are connected to a collector of NPN bipolar transistor 32, and a collector of PNP bipolar transistor 25 is connected to output terminal 20.

NPN bipolar transistors 32 and 17 are connected to NPN bipolar transistor 30 as a current mirror circuit, by connecting the bases of bipolar transistors 32 and 17 to a base of bipolar transistor 30 whose base is connected to its collector.

A collector of NPN bipolar transistor 30 is connected to power source Vcc through constant current source $I_0$ and the collector is grounded through T/M circuit 7. A collector of NPN bipolar transistor 32 is connected to a collector and a base of PNP bipolar transistor 23, while an emitter of NPN bipolar transistor 32 is grounded through T/M circuit 8. A collector of NPN bipolar transistor 17 is connected to output terminal 20, while an emitter is grounded through T/M circuit 10.

Transistor sizes of PNP bipolar transistors 23 and 25 are the same, while transistor sizes of NPN bipolar transistors 30, 32, and 17 are also the same.

In such a charge pump circuit, since NPN bipolar transistors 32, and 17 are connected to NPN bipolar transistor 30 as a current mirror, respective collector currents of NPN bipolar transistor 17 are equal to constant current $I_0$ supplied from constant current source 13.

In such a circuit, in case that input signal B is behind input signal A as shown in FIG. 19, when up-signal UP (H) and down-signal DOWN (L) are inputted to up-terminal 14 and down-terminal 15 of charge pump circuit 220, respectively, up-signal (H) is applied to T/M circuit 39, down-signal DOWN (L) is applied to T/M circuit 10, then T/M circuit 39 turns on and T/M circuit 10 turn off. Therefore, since current flows through only T/M circuit 39 and does not flow through T/M circuit 10, constant current $I_0$ is supplied via output terminal 20 only from a collector of PNP bipolar transistor 25.

As shown in FIG. 19, in case of input signal B precedes input signal A, when up-signal UP (L) and down-signal DOWN (H) are inputted to up-terminal 14 and down-terminal 15 of charge pump circuit 220, respectively, up-signal (L) is applied to T/M circuit 39, down-signal DOWN (H) is applied to T/M circuit 10, then T/M circuit 39 turns off and T/M circuit 10 turn on. Therefore, current flows through only T/M circuit 10 and does not flow through T/M circuit 39. Accordingly, constant current $I_0$ is drawn out from output terminal 20 by collector current $I_0$ of NPN bipolar transistor 17.

As described above, charge pump circuit 220 supplies or draws out constant current $I_0$ via output terminal 20 according to respective modes of up-signal UP and down-signal DOWN of digital phase comparator 210.

Figure 7:
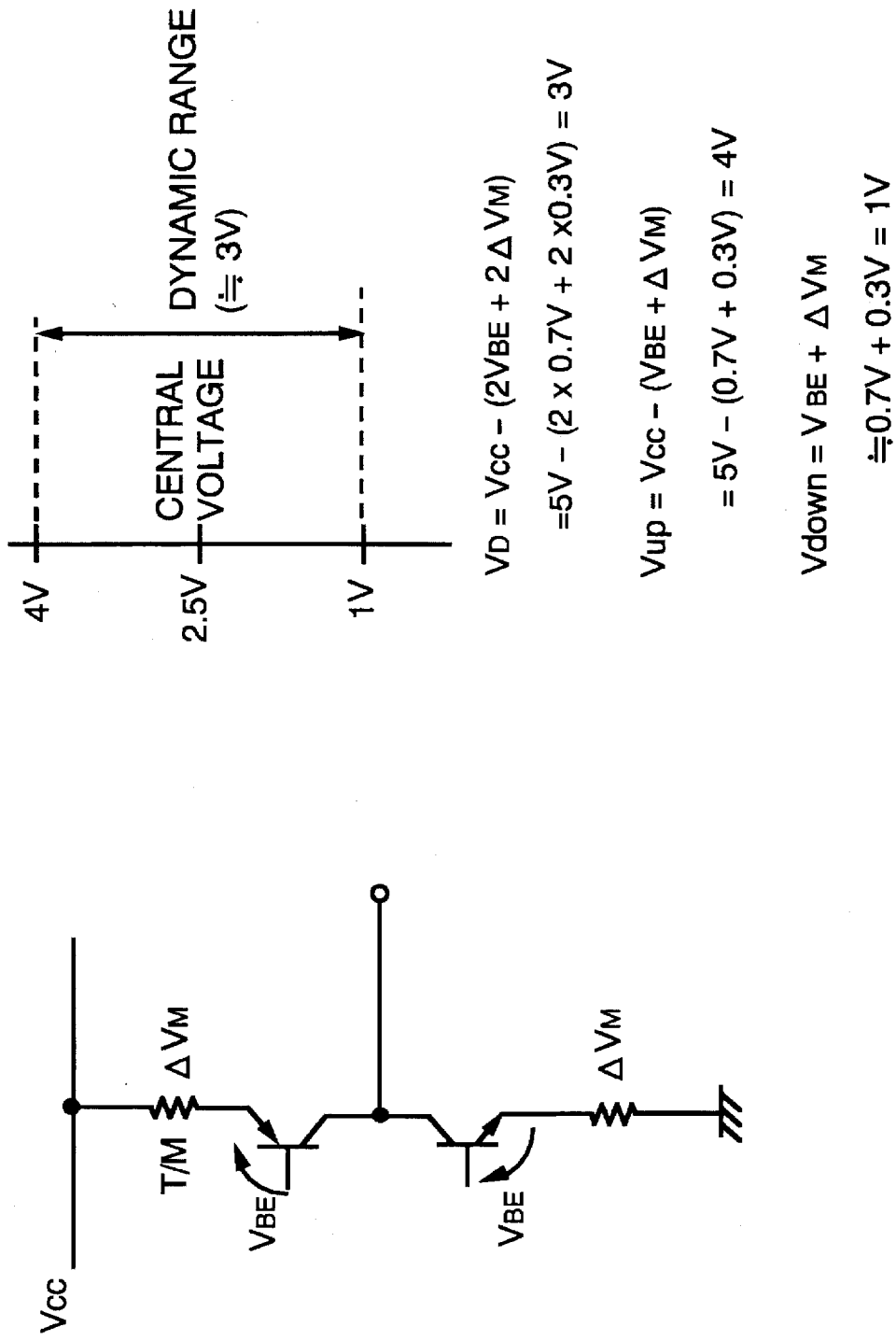
FIGS. 7A, 7B show how to calculate output dynamic range in a third embodiment and a fourth embodiment of the present invention.

FIGS. 7A, 7B show how to calculate output dynamic range in a third embodiment. As shown in FIG. 7A, output dynamic range of output terminal 20 in this circuit can be calculated by following formula, $$Vcc-(2\ V_{BE}+2\ \Delta V_M),$$

where, $\Delta V_M$: voltage which is dropped at ON resistor of transmission gate connected to emitter resistor of transistor (=approximately 0.3 V), $V_{BE}$: voltage between a base and an emitter of a transistor (=approximately 0.7 V).

For example, the width of dynamic range is calculated as follows. As shown in FIG. 7B, upper limit $V_{UP}$ of dynamic range is calculated such as, $$V_{UP}=Vcc-(V_{BE}+\Delta V_M)=5\ V-(0.7\ V+0.3\ V)=3\ V,$$

and lower limit $V_{DOWN}$ of dynamic range is calculated such as, $$V_{DOWN}=V_{BE}+\Delta V_M=0.7\ V+0.3\ V=1\ V.$$

Therefore, dynamic range VD is calculated such as, $$V_D=\text{upper limit } V_{UP} \text{ of dynamic range--lower limit } V_{DOWN} \text{ of dynamic range}=4\ V-1\ V=3\ V.$$

Therefore, the above result shows the same value as that of the first embodiment.

Accordingly, dynamic range of the present invention improves in its width by $V_{BE}$ (0.7 V) in comparison with 2.3 V of the dynamic range in a conventional circuit.

Also in the third embodiment, wide dynamic range can be obtained. Further, the impedance of output terminal 20 can be high by turning off T/M circuit 39 and T/M circuit 10.

Embodiment 4

Figure 6:
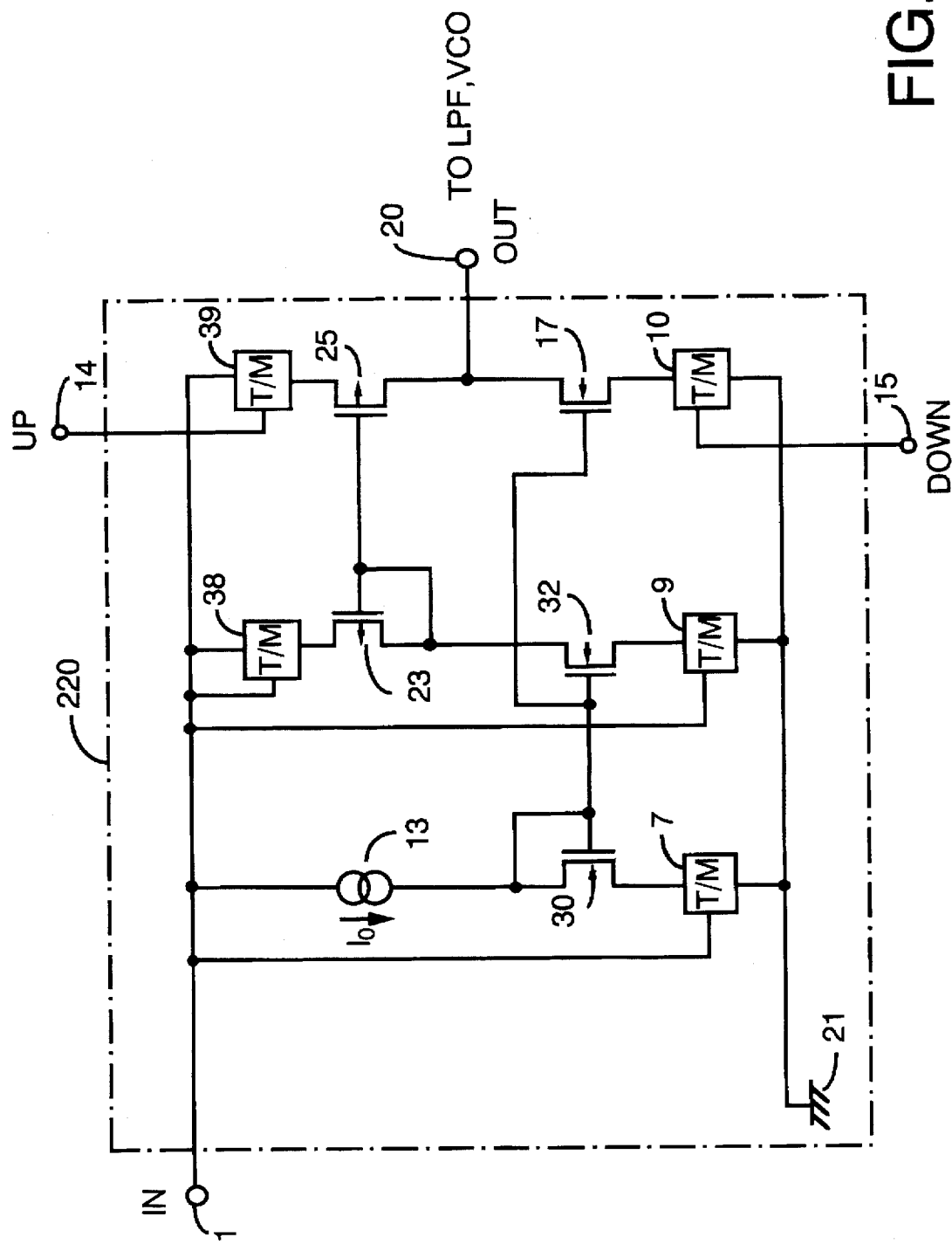
FIG. 6 shows a concrete construction of a charge pump circuit in a fourth embodiment of the present invention.

FIG. 6 shows a circuit in which PNP bipolar transistors 23 and 25 in charge pump circuit 220 of the third embodiment are replaced by CMOS transistors 23 and 25, respectively, and NPN bipolar transistors 30, 32 and 17 in FIG. 3 are replaced respectively by CMOS transistors 30, 32 and 17, respectively. Since an operation of this circuit in this fourth embodiment is the same as that of the circuit in the third embodiment, detailed explanation is omitted. In the fourth embodiment, every circuit is composed of CMOS. Therefore, manufacturing of PLL becomes easier than the third embodiment. Further, the impedance of output terminal 20 can be high by turning off the two T/M circuits 39 and 10 like the third embodiment.

Embodiment 5

Figure 8:
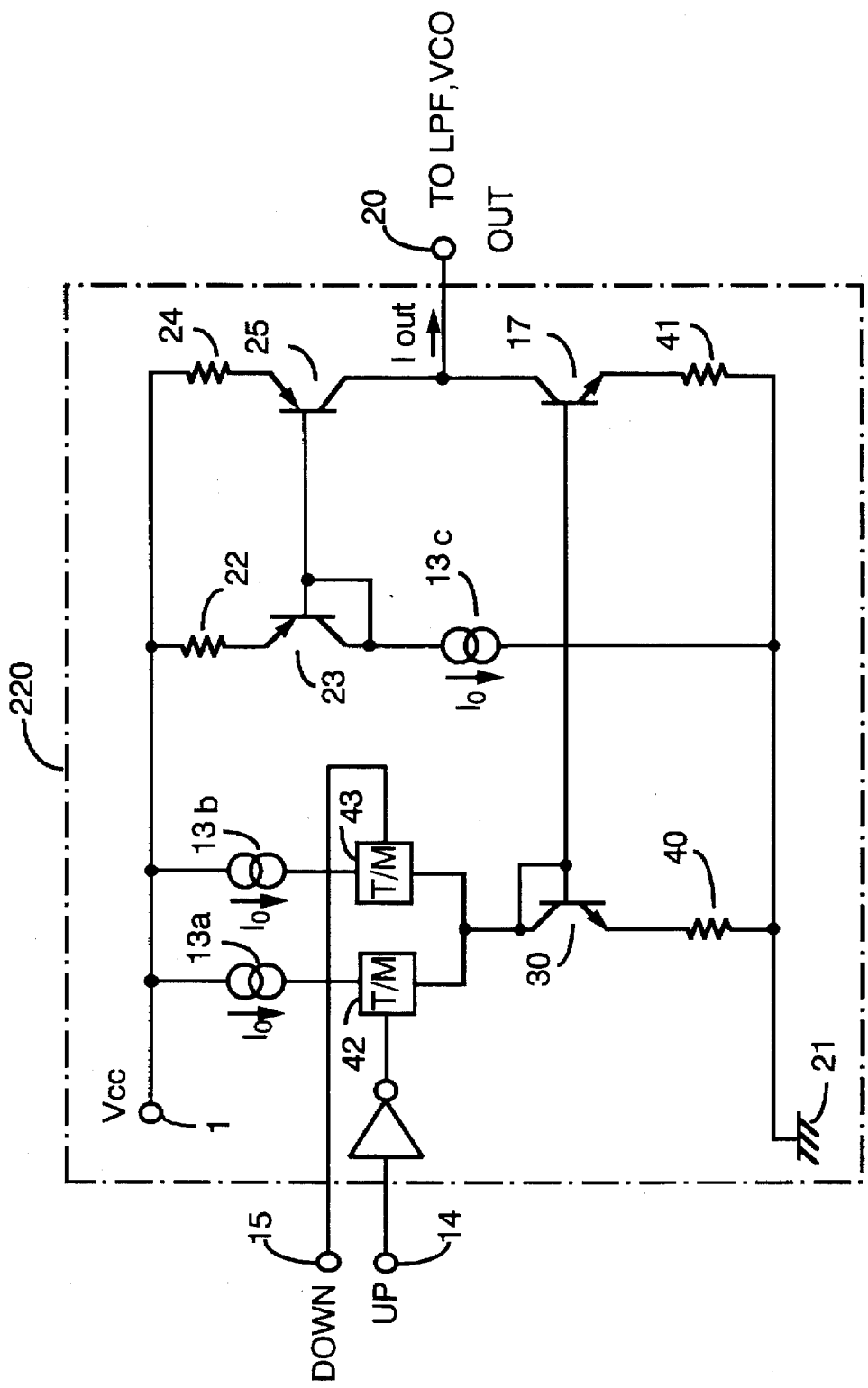
FIG. 8 shows a concrete construction of a charge pump circuit in a fifth embodiment of the present invention.

FIG. 8 shows a concrete construction of a charge pump circuit 220 of a fifth embodiment of the present invention. As shown in FIG. 8, PNP bipolar transistors 23 and 25 comprise a current mirror circuit by connecting their bases in common. An emitter of PNP bipolar transistor 23 is connected to power source Vcc through resistor 22, and an emitter of PNP bipolar transistor 25 is connected to power source Vcc through resistor 24. A base and a collector of PNP bipolar transistor 23 are connected to constant current source 13, the other end of constant current source 13 is grounded. A collector of PNP bipolar transistor 25 is connected to output terminal 20.

A base of NPN bipolar transistor 17 is connected in common to a base of NPN bipolar transistor 30 whose base is connected to its collector. Therefore, NPN bipolar transistor 17 constructs a current mirror circuit with NPN bipolar transistor 30.

A collector of NPN bipolar transistor 30 is connected to power source Vcc through constant current source 13a and T/M 42 and also through constant current source 13b and T/M 43, and an emitter of NPN bipolar transistor 30 is grounded through resistor 40. A collector of NPN bipolar transistor 17 is connected to output terminal 20, while an emitter is grounded through resistor 41.

In such a charge pump circuit, NPN bipolar transistor 17 is connected to NPN bipolar transistor 30 as a current mirror. Therefore, collector current of PNP bipolar transistor 25 and NPN bipolar transistor 17 is equal to any current which is provided from constant current sources 13a and 13b, that is, $I_0$, $2I_0$ or zero.

In the above mentioned circuit, in case that input signal B precedes input signal A, when up-signal UP (H) and down-signal DOWN (L) as shown in FIG. 19 are inputted to respective up-terminal 14 and down-terminal 15 of charge pump circuit 220, respectively, inverted up-signal (L) is applied to T/M circuit 42, down-signal DOWN (L) is applied to T/M circuit 43, then both of T/M circuits 42 and 43 turn off. Therefore, since current flows through neither NPN bipolar transistor 30 nor NPN bipolar transistor 17, collector current $I_0$ is supplied to output terminal 20 only from PNP bipolar transistor 25.

As shown in FIG. 19, in case that input signal B precedes input signal 1, when up-signal UP (L) and down-signal DOWN (H) is inputted to up-terminal 14 and down-terminal 15 of charge pump circuit 220, respectively, inverted up-signal (H) is applied to T/M circuit 42, down-signal DOWN (H) is applied to T/M circuit 43, then both of T/M circuits 42 and 43 turn on as shown in FIG. 10. Therefore, current $2I_0$ flows through NPN bipolar transistor 17. Accordingly, PNP bipolar transistor 25 provides collector current $I_0$ to output terminal 20, and $2I_0$ is drawn out from NPN bipolar transistor 17. Accordingly, constant current $I_0$ is drawn out from output terminal 20, since $I_0-2I_0=-I_0$.

As shown in FIG. 10, when input signal A synchronizes with input signal B, both up-signal UP and down-signal DOWN become (L) or (H, respectively. Therefore, $I_{OUT}$ from output terminal 20 becomes zero.

Figure 11B:
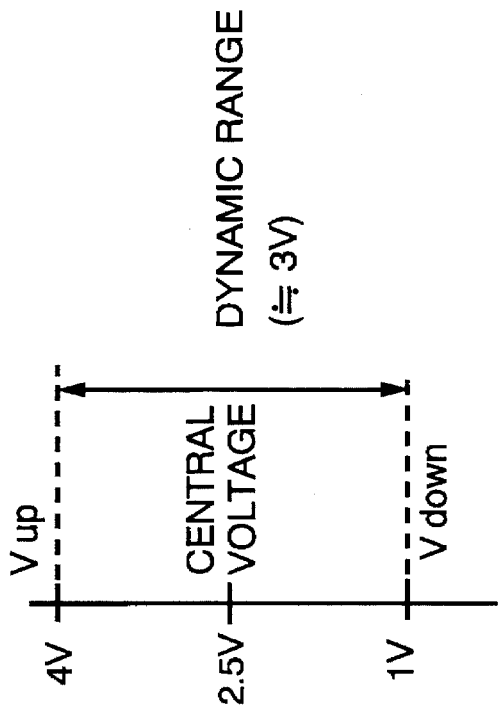
FIGS. 11A, 11B show how to calculate output dynamic range in a fifth embodiment and a sixth embodiment of the present invention.
Figure 11A:
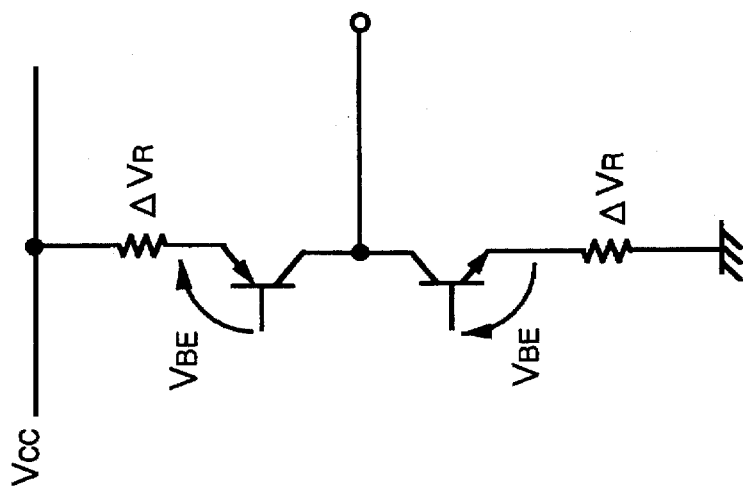

FIGS. 11A, 11B show how to calculate output dynamic range in a fifth embodiment of this present invention. As shown in FIG. 11A, output dynamic range of output terminal 20 in this circuit can be calculated by following formula, $$Vcc-(2 V_{BE}+2\Delta V_R),$$

where, $\Delta V_R$: voltage which is dropped an emitter resistor of a transistor (=approximately 0.3 V), $V_{BE}$: voltage between a base and an emitter of a transistor (=approximately 0.7 V).

For example, the width of dynamic range is calculated as follows. As shown in FIG. 11B, upper limit $V_{UP}$ of dynamic range is calculated such as, $$V_{UP}=Vcc-(V_{BE}+\Delta V_R)=5 V-(0.7 V+0.3 V)=4 V,$$

and lower limit $V_{DOWN}$ of dynamic range is calculated such as, $$V_{DOWN}=V_{BE}+\Delta VR=0.7 V+0.3 V=1 V.$$

Therefore, dynamic range $V_D$ is calculated such as, $V_D$=upper limit $V_{UP}$ of dynamic range–lower limit $V_{DOWN}$ of dynamic range=4 V–1 V=3 V.

Accordingly, dynamic range of the present invention improves its width by $V_{BE}$ (0.7 V) in comparison with 2.3 V of the dynamic range in the conventional circuit.

As a result, in PLL circuit shown in FIG. 12, when charge pump circuit of the first embodiment is substituted for conventional charge pump circuit 220, voltage range of control voltage SV in voltage control oscillator 400 can be widened and width of oscillation frequency of input signal B, which is an output of voltage control oscillator 400, is also widened. Therefore, lock range of PLL circuit can be set wider than the conventional PLL circuit. This is advantageous especially when PLL circuit operates under reduced voltage or low voltage.

Embodiment 6

Figure 9:
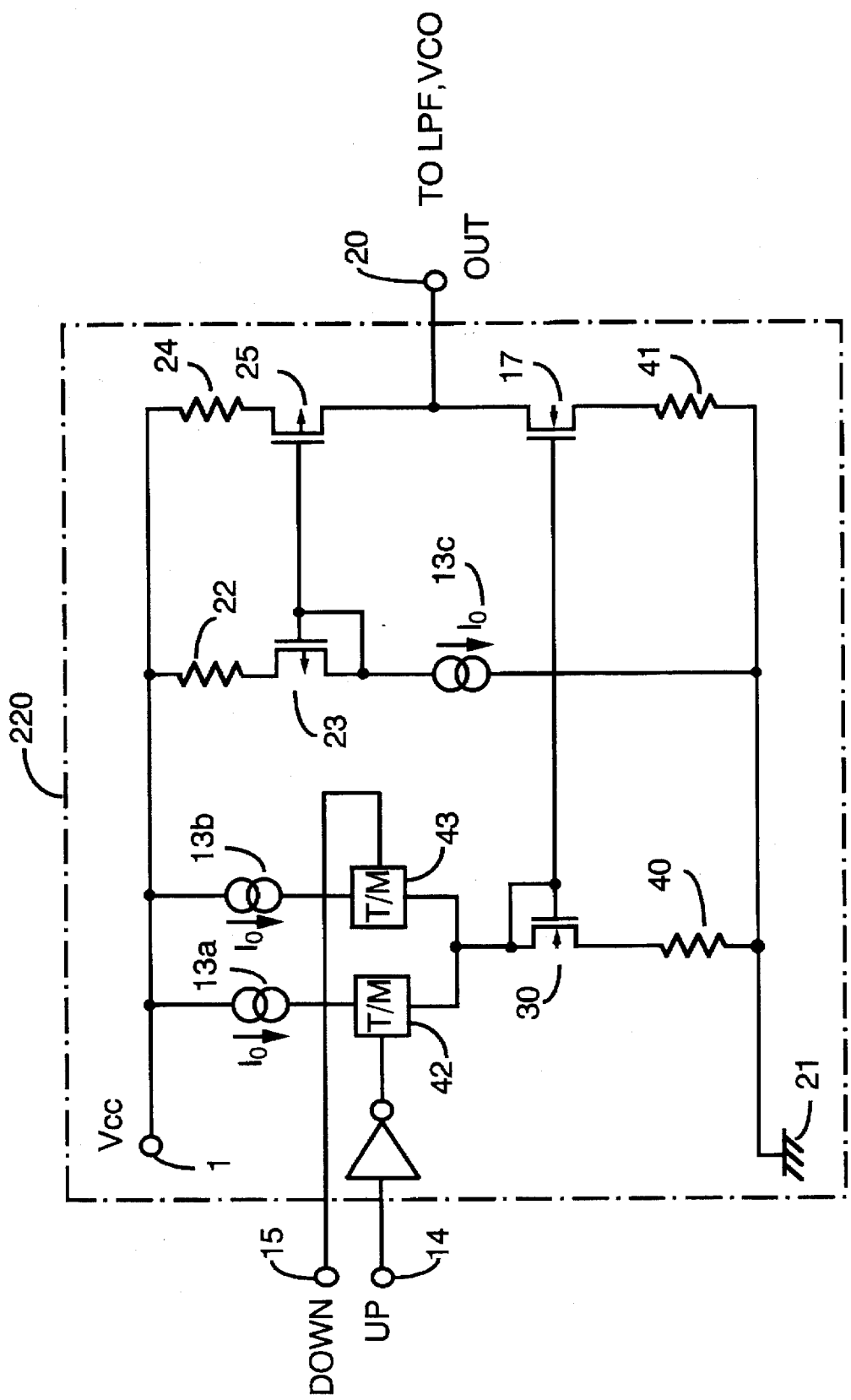
FIG. 9 shows a concrete construction of a charge pump circuit in a sixth embodiment of the present invention.

FIG. 9 shows a charge pump circuit in which PNP bipolar transistors 23 and 25 in the fifth embodiment (FIG. 8) are replaced by CMOS transistors 23 and 25, respectively, and NPN bipolar transistors 30 and 17 are replaced respectively by CMOS transistors 30 and 17. Since an operation of this circuit in this sixth embodiment is the same as that of the fifth embodiment, detailed explanation is omitted. In the sixth embodiment, every circuit is composed of CMOS. Therefore, manufacturing of a PLL becomes easier than the fifth embodiment.

What is claimed is:

1. A charge pump circuit comprising:
    a first circuit including a first transistor for supplying a first constant current to an output terminal;
    a second circuit including a second transistor for supplying a second constant current to the output terminal;
    a third circuit including a third transistor for supplying a third constant current to the output terminal;
    a fourth circuit including a fourth transistor connected to said first circuit by current mirror connection for supplying constant current to said first circuit, and further comprising a fifth transistor for supplying constant current to the fourth transistor; and
    a fifth circuit comprising a sixth transistor connected to a first constant current source in series for supplying constant current to the fifth transistor in the fourth circuit, to the second transistor in the second circuit and to the third transistor in the third circuit, each of the second, third and fifth transistors being connected by current mirror connection; and
    first and second T/M circuits;
    wherein respective first ends of the first to third transistors are connected to said output terminal, and (1) a second end of the first transistor is connected to a power source through a first resistor, (2) a second end of the second transistor is grounded through the first T/M circuit, (3) a second end of the third transistor is grounded through the second T/M circuit, and
    an inverted up-signal is applied to said second T/M circuit, a down-signal is applied to said first T/M circuit in order to supply current to or draw current from said output terminal.

2. A charge pump circuit of claim 1 wherein, each of the first to sixth transistors is a bipolar transistor.

3. A charge pump circuit of claim 1 wherein, each of the first to sixth transistors is a MOS transistor.

4. A charge pump circuit comprising:
    a first circuit including a first transistor for supplying a first constant current to an output terminal;

a second circuit including a second transistor for supplying a second constant current to the output terminal;

a third circuit comprising a third transistor which is connected to said first circuit by current mirror connection for supplying constant current to said first circuit and further comprising a fourth transistor for supplying constant current to said third transistor; and a fourth circuit comprising a fifth transistor which is connected to a constant current source in series for supplying constant current to the fourth transistor in said third circuit and to the second transistor in said second circuit which are connected by current mirror connection;

first and second T/M circuits;

respective first ends of the first and second transistors are connected to said output terminal, and (1) a second end of the first transistor is connected to a power source through the first T/M circuit, (2) a second end of the second transistor is grounded through the second T/M circuit, and an up-signal is applied to said first T/M circuit, a down-signal is applied to said second T/M circuit in order to supply current to or to draw current from the output terminal.

5. The charge pump circuit of claim 4 wherein each of the first to fifth transistors is a bipolar transistor.

6. The charge pump circuit of claim 4 wherein each of the first to fifth transistors is an MOS transistor.

7. A charge pump circuit comprising:

a first circuit including a first transistor for supplying a first constant current to an output terminal;

a second circuit including a second transistor for supplying a second constant current to the output terminal;

a third circuit comprising a third transistor which is connected to said first circuit by current mirror connection for supplying constant current to said first circuit, and further comprising a first constant current source for supplying constant current to said third transistor, and a fourth circuit comprising a first T/M circuit connected in series to a second current source, a second T/M circuit connected in series to a third constant current source, said two series circuits being connected in parallel to each other for providing constant current to a fourth transistor, said fourth transistor being connected to the second transistor by current mirror connection for supplying constant current thereto; wherein, an inverted up-signal is applied to the first T/M circuit, and a down-signal is applied to the second T/M circuit in order to supply current to or draw current from said output terminal.

8. The charge pump circuit of claim 7 wherein each of the first to fourth transistors is a bipolar transistor.

9. The charge pump circuit of claim 7 wherein each of the first to fourth transistors is a MOS transistor.

10. A PLL circuit comprising:

a phase comparison means which receives first and second input signals for outputting comparison signals according to the phase difference between the first and second input signals;

a charge pump circuit which outputs current according to said comparison signals, said charge pump circuit including a first circuit including a first transistor for supplying a first constant current to an output terminal;

a second circuit including a second transistor for supplying a second constant current to the output terminal;

a third circuit including a third transistor for supplying a third constant current to the output terminal;

a fourth circuit comprising a fourth transistor which is connected to said first circuit by current mirror connection for supplying constant current to said first circuit, and further comprising a fifth transistor for supplying constant current to said fourth transistor;

first and second T/M circuits; and a fifth circuit comprising a sixth transistor which is connected to a first constant current source in series for supplying constant current to said fifth transistor in the fourth circuit, to said second transistor in the second circuit and to said third transistor in the third circuit which are connected by current mirror connection; wherein, respective first ends of the first to third transistors are connected to said output terminal, and (1) a second end of the first transistor is connected to a power source through a first resistor, (2) a second end of the second transistor is grounded through the first T/M circuit, (3) a second end of the third transistor is grounded through the second T/M circuit, and an inverted up-signal is applied to the second T/M circuit, and a down-signal is applied to the first T/M circuit in order to supply current to or draw current from said output terminal;

a filtering circuit which outputs a control voltage by filtering the output current received from said charge pump circuit and an oscillation means which outputs the second input signals whose oscillation frequency is controlled by the control voltage.

11. A PLL circuit comprising:

a phase comparison means which receives first and second input signals for outputting comparison signals according to a phase difference between the first and second input signals;

a charge pump circuit which outputs current according to the comparison signals, said charge pump circuit including a first circuit including a first transistor for supplying a first constant current to an output terminal;

a second circuit including a second transistor for supplying a second constant current to the output terminal;

a third circuit including a third transistor connected to said first circuit for supplying a third constant current to said first circuit and a fourth transistor for supplying constant current to the third transistor;

a fourth circuit comprising a fifth transistor which is connected to a constant current source in series for supplying constant current to the fourth transistor and the second transistor, the fourth transistor and the second transistor being connected with the fifth transistor by a current mirror connection; and first and second T/M circuits; wherein, respective first ends of the first and second transistors are connected to said output terminal, and (1) a second end of the first transistor is connected to a power source through the first T/M circuit, (2) a second end of the second transistor is grounded through the second T/M circuit, and an up-signal is applied to the first T/M circuit, and a down-signal is applied to the second T/M circuit in order to supply current to or draw current from said output terminal;

a filtering circuit which outputs a control voltage by filtering the output current received from said charge pump circuit; and an oscillation means for outputting the second input signals, the second input signals having an oscillation frequency controlled by the control voltage.

12. A PLL circuit comprising:

a phase comparison means which receives first and second input signals and outputs comparison signals according to a phase difference between the first and second input signals;

a charge pump circuit which outputs current according to said comparison signals, said charge pump circuit including a first circuit including a first transistor for supplying a first constant current to an output terminal;

a second circuit including a second transistor for supplying a second constant current to the output terminal;

a third circuit including a third transistor, the third circuit being connected to the first circuit by current mirror connection for supplying a third constant current to the first circuit;

a first constant current source for supplying constant current to the third transistor;

a fourth circuit comprising a first T/M circuit connected in series to a second constant current source, a second T/M circuit connected in series to a third constant current source, the two series circuits being connected in parallel to each other for providing constant current to a fourth transistor, the fourth transistor being connected to the second transistor by a current mirror connection; wherein an inverted up-signal is applied to the first T/M circuit, a down-signal is applied to the second T/M circuit in order to supply current to or draw current from said output terminal.

* * * * *